United States Patent
Ashida

(10) Patent No.: US 9,011,636 B2
(45) Date of Patent: Apr. 21, 2015

(54) AUTOMATIC MATCHING METHOD, COMPUTER-READABLE STORAGE MEDIUM, AUTOMATIC MATCHING UNIT, AND PLASMA PROCESSING APPARATUS

(75) Inventor: Mitsutoshi Ashida, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 721 days.

(21) Appl. No.: 13/040,719

(22) Filed: Mar. 4, 2011

(65) Prior Publication Data

US 2011/0214811 A1  Sep. 8, 2011

Related U.S. Application Data

(60) Provisional application No. 61/317,460, filed on Mar. 25, 2010.

(30) Foreign Application Priority Data

Mar. 4, 2010 (JP) .................. 2010-048291

(51) Int. Cl.
*C23C 16/50* (2006.01)
*C23C 16/52* (2006.01)
*H03H 7/38* (2006.01)
*H03H 7/40* (2006.01)
*H01J 37/32* (2006.01)
*C23F 1/08* (2006.01)

(52) U.S. Cl.
CPC .................. *C23C 16/50* (2013.01); *H03H 7/40* (2013.01); *H01J 37/32183* (2013.01); *C23C 16/52* (2013.01); *C23F 1/08* (2013.01); *H03H 7/38* (2013.01)

(58) Field of Classification Search
USPC ......... 118/715, 723 R, 723, 663; 156/345.24, 156/345.28, 345.44, 345.1; 333/17.3, 32, 333/33
See application file for complete search history.

(56) References Cited

U.S. PATENT DOCUMENTS 3,443,231 A * 5/1969 Roza ............................. 455/123
3,995,237 A * 11/1976 Brunner ....................... 333/17.3
(Continued)

FOREIGN PATENT DOCUMENTS

| JP | 10-209789 | 8/1998 |
|---|---|---|
| JP | 2003-5802 A | 1/2003 |
| JP | 2008-53496 A | 3/2008 |

*Primary Examiner* — Parviz Hassanzadeh
*Assistant Examiner* — Stanislav Antolin
(74) *Attorney, Agent, or Firm* — Rothwell, Figg, Ernst & Manbeck, P.C.

(57) ABSTRACT

A controller 90 of an automatic matching unit includes a first and a second matching control unit 100, 102 for respectively variably controlling the electrostatic capacitances of a first and a second variable capacitors 80, 82 through a first and a second stepping motor 86, 88 such that a measured absolute value $ZM_m$ and a measured phase $Z\theta_m$ of a load impedance obtained by an impedance measuring unit 84 become close to a predetermined reference absolute value $ZM_s$ and a predetermined reference phase $Z\theta_s$, respectively; and a gain control unit 112. The gain control unit 112 variably controls a proportional gain of at least one of the first and the second matching unit based on current electrostatic capacitances $NC_1$ and $NC_2$ of the first and the second variable capacitors 80, 82 obtained by a first and a second electrostatic capacitance monitoring unit 108, 110, respectively.

3 Claims, 13 Drawing Sheets

(56) References Cited

U.S. PATENT DOCUMENTS

| | | | |
|---|---|---|---|
| 4,948,458 A * | 8/1990 | Ogle | 438/729 |
| 5,187,454 A * | 2/1993 | Collins et al. | 333/32 |
| 5,195,045 A * | 3/1993 | Keane et al. | 702/107 |
| 5,629,653 A * | 5/1997 | Stimson | 333/17.3 |
| 5,689,215 A * | 11/1997 | Richardson et al. | 333/17.3 |
| 5,759,280 A * | 6/1998 | Holland et al. | 118/723 I |
| 5,793,162 A * | 8/1998 | Barnes et al. | 315/111.21 |
| 5,872,456 A * | 2/1999 | Roderick et al. | 324/637 |
| 6,174,450 B1 * | 1/2001 | Patrick et al. | 216/61 |
| 6,259,334 B1 * | 7/2001 | Howald | 333/17.3 |
| 6,265,831 B1 * | 7/2001 | Howald et al. | 315/111.21 |
| 6,291,999 B1 * | 9/2001 | Nishimori et al. | 324/464 |
| 6,313,584 B1 * | 11/2001 | Johnson et al. | 315/111.21 |
| 6,627,464 B2 * | 9/2003 | Coumou | 438/9 |
| RE39,051 E * | 3/2006 | Harnett | 702/106 |
| 7,332,981 B2 * | 2/2008 | Matsuno | 333/17.3 |
| 7,646,267 B1 * | 1/2010 | Tsironis | 333/263 |
| 2006/0220574 A1 * | 10/2006 | Ogawa | 315/111.21 |
| 2007/0121267 A1 * | 5/2007 | Kotani et al. | 361/85 |
| 2008/0179948 A1 * | 7/2008 | Nagarkatti et al. | 307/18 |
| 2009/0066438 A1 * | 3/2009 | Kim et al. | 333/17.3 |

\* cited by examiner

AUTOMATIC MATCHING METHOD, COMPUTER-READABLE STORAGE MEDIUM, AUTOMATIC MATCHING UNIT, AND PLASMA PROCESSING APPARATUS

FIELD OF THE INVENTION

The present invention relates to an automatic matching method for automatically matching an impedance between a radio frequency (RF) power supply and a load, a computer readable storage medium, an automatic matching unit and a plasma processing apparatus using the same.

BACKGROUND OF THE INVENTION

In a manufacturing process of a semiconductor device or a flat panel display (FPD), a plasma processing apparatus for performing etching, deposition, oxidation, sputtering or the like by using a plasma is widely used. In the plasma processing apparatus, in order to use a RF power for plasma generation, a RF power of a predetermined frequency (generally, 13.56 MHz or above) is supplied from a RF power supply unit to a RF electrode (or an antenna) provided inside or outside a chamber. Further, in order to freely control energy of ions incident to a target substrate from a plasma, a RF power of a predetermined frequency (generally, 13.56 MHz or less) is supplied from the RF power supply unit to a RF electrode of a mounting table for mounting thereon the substrate.

The RF power supply unit includes a RF power supply for outputting a RF power and a matching unit for matching an impedance of the RF power side and an impedance of a load side (electrode, plasma and chamber). The RF power supply and a transmission cable are designed to have an output resistance of about 50Ω, and the impedance in the matching unit is set or controlled such that the impedance of the load side including the matching circuit becomes about 50Ω, i.e., such that the power of the reflected wave becomes minimum.

In general, the matching unit used in the plasma processing apparatus includes a plurality of variable reactance elements, and is configured as an automatic matching unit capable of variably controlling the load impedance by selecting impedance positions or reactances of the variable reactance elements by a stepping motor or the like.

If the impedance of the plasma load changes due to a pressure change or the like during the plasma processing, the automatic matching unit automatically corrects the load impedance to a matching point (50Ω) by variably controlling the reactances of the variable reactance elements. In order to perform the automatic matching operation, the automatic matching unit is provided with a circuit for measuring a load impedance, a controller that variably controls a reactance of each variable reactance element by a stepping motor to match the measured value of the load impedance to the matching point (50Ω), and the like.

In general, the automatic matching unit includes two variable capacitors serving as the variable reactance elements in the matching circuit, the variable capacitors being respectively connected in parallel and in series to the load with respect to the RF power supply. Here, the electrostatic capacitance of the first variable capacitor connected to the load in parallel operates to variably control mainly the absolute value of the load impedance. Meanwhile, the electrostatic capacitance of the second variable capacitor connected to the load in series operates to variably control mainly the phase of the load impedance (phase difference between RF voltage and RF current).

A conventional typical automatic matching unit varies the electrostatic capacitance (capacitance position) of the first variable capacitor in a stepwise manner such that a measured absolute value and a measured phase of a load impedance obtained by an impedance measuring circuit become close to matching point values, i.e., a reference absolute value and a reference phase, respectively, and also varies the electrostatic capacitance (capacitance position) of the second variable capacitor such that the phase error becomes close to zero (e.g., Japanese Patent Application Publication No. H10-209789).

In the plasma processing apparatus, the impedance of the plasma load changes dynamically and indefinitely due to a pressure change in the chamber or the like. Therefore, the automatic matching unit needs to perform an automatic matching operation capable of responding to changes in the load impedance rapidly and accurately.

However, in the conventional automatic matching unit, a first and a second feedback control system for variably controlling the electrostatic capacitances (capacitance positions) of the first and the second variable capacitor in accordance with the measured value of the load impedance obtained by the impedance measuring circuit are configured to operate at a constant proportional gain (proportional sensitivity).

However, the load impedance varies near the matching point such that the variation of the load impedance per one step in the second feedback control system, particularly the variation of the phase increases remarkably, which may lead to hunting. Therefore, the proportional gain of the second feedback control system is adjusted in advance so as to be relatively smaller than that of the first feedback control system. However, this causes unnecessary speed decrease in a matching operation and cannot be a radical solution.

SUMMARY OF THE INVENTION

In view of the above, the present invention provides an automatic matching method and an automatic matching unit capable of suppressing hunting reliably and effectively without causing unnecessary speed decrease, and a computer readable storage medium storing the automatic matching method.

Further, the present invention provides a plasma processing apparatus capable of improving functions of plasma generation using a RF power and ion attraction control by improving an automatic matching function and further capable of improving reproducibility and reliability of a plasma process.

In accordance with a feature of the present invention, there is provided an automatic matching method for automatically matching an impedance between a radio frequency (RF) power supply for outputting a RF power of a predetermined frequency and a load to which the RF power is supplied, the automatic matching method including: measuring at regular cycles an absolute value and a phase of a load impedance seen from an output terminal of the RF power supply; varying in a stepwise manner a reactance of a first variable reactance element provided at a rear part of the impedance measuring unit viewed from the RF power supply on a RF transmission line to control mainly the absolute value of the load impedance and varying in a stepwise manner a reactance of a second variable reactance element provided at a rear part of the impedance measuring unit viewed from the RF power supply on the RF transmission line to control mainly the phase of the load impedance such that the measured absolute value and the measured phase of the load impedance obtained by the impedance measuring unit become close to a predetermined reference absolute value and a predetermined reference phase, respectively; monitoring reactances of the first and the second reactance element directly or indirectly; and variably controlling a proportional gain of at least one of a first and a second feedback control system for respectively varying the reactances of the first and the second variable reactance element based on current reactances of the first and the second variable reactance element.

Further, there is provided a computer readable storage medium storing a control program operating on a computer, wherein the control program, when executed, controls an automatic matching unit to perform the automatic matching method.

The automatic matching method or the computer readable storage medium are effective when hunting easily occurs due to large unbalance generated between the variation of the load impedance per one step in the first feedback control system and the variation of the load impedance per one step in the second feedback control system in accordance with the reactances of the first and the second variable reactance element. In other words, the unbalance of the load impedance variation can be compensated by variably controlling the proportional gain of at least one of the first and the second feedback control system based on the current values of the first and the second variable reactance element. Accordingly, the hunting can be effectively suppressed in the automatic matching operation. Further, the proportional gain is conditionally varied by the adaptive control, so that unnecessary speed decrease in the matching operation is not caused.

In accordance with a first aspect of the present invention, there is provided an automatic matching unit for automatically matching an impedance between a RF power supply for outputting a RF power of a predetermined frequency and a load to which the RF power is supplied, the automatic matching unit including: an impedance measuring unit for measuring at regular cycles an absolute value and a phase of a load impedance seen from an output terminal of the RF power supply; a first variable reactance element, provided at a rear part of the impedance measuring unit seen from the RF power supply on a RF transmission line, for controlling mainly the absolute value of the load impedance; a first stepwise capacitance varying mechanism for varying a reactance of the first variable reactance element in a stepwise manner; a second variable reactance element, provided at a rear part of the impedance load seen from the RF power supply on a RF transmission line, for controlling mainly the phase of the load impedance; a second stepwise capacitance varying mechanism for varying a reactance of the second variable reactance element in a stepwise manner; a first and a second matching control unit for respectively variably controlling the reactances of the first and the second variable reactance element through the first and the second stepwise capacitance varying mechanism such that the measured absolute value and the measured phase of the load impedance obtained by the impedance measuring unit become close to a predetermined reference absolute value and a predetermined reference phase, respectively; a reactance monitoring unit for directly or indirectly monitoring the reactances of the first and the second variable reactance element; and a gain control unit for variably controlling a proportional gain of at least one of the first and the second matching unit based on current reactances of the first and the second variable reactance element obtained by the reactance monitoring unit.

The automatic matching unit of the first aspect can deal with the case in which hunting easily occurs due to large unbalance generated between the variation of the load impedance per one step in the first feedback control system and the variation of the load impedance per one step in the second feedback control system in accordance with the reactances of the first and the second variable reactance element. In other word, the unbalance of the load impedance variation can be compensated by variably controlling a proportional gain of at least one of the first and the second feedback control system based on the current values of the first and the second variable reactance element. Hence, the hunting can be effectively suppressed in an automatic matching operation. Moreover, the proportional gain is conditionally varied by the adaptive control, so that unnecessary speed decrease in the matching operation is not caused.

In accordance with a second aspect of the present invention, there is provided an automatic matching unit for automatically matching a RF power supply for outputting an RF power having a high frequency and a load to which the RF power is supplied, the automatic matching unit including: an impedance measuring unit for measuring at regular cycles an absolute value and a phase of a load impedance seen from an output terminal of the RF power supply; a first variable capacitor, provided at a rear part of the impedance measuring unit seen from the RF power supply on a RF transmission line, for controlling mainly the absolute value of the load impedance; a first stepwise capacitance varying mechanism for varying an electrostatic capacitance of the first variable capacitor in a stepwise manner; a second variable capacitor provided at a rear part of the impedance load seen from the RF power supply on the RF transmission line, for controlling mainly the phase of the load impedance; a second stepwise capacitance varying mechanism for varying an electrostatic capacitance of the second variable capacitor in a stepwise manner; a first and a second matching control unit for respectively variably controlling the electrostatic capacitances of the first and the second variable reactance element through the first and the second stepwise capacitance varying mechanism such that the measured absolute value and the measured phase of the load impedance obtained by the impedance measuring unit become close to a predetermined reference absolute value and a predetermined reference phase, respectively; an electrostatic capacitance monitoring unit for directly or indirectly monitoring the electrostatic capacitances of the first and the second variable capacitor; and a gain control unit for variably controlling a proportional gain of at least one of the first and the second matching control unit in accordance with current electrostatic capacitances of the first and the second variable capacitor.

In accordance with a third aspect of the present invention, there is provided an automatic matching unit for automatically matching an impedance between a RF power supply for outputting a RF power of a predetermined frequency and a load to which the RF power is supplied, the automatic matching unit including: a first variable capacitor connected in parallel to the load with respect to the RF power supply; a first stepwise capacitance varying mechanism for varying an electrostatic capacitance of the first variable capacitor in a stepwise manner; a second variable capacitor connected in series to the load with respect to the RF power supply; a second stepwise capacitance varying mechanism for varying an electrostatic capacitance of the second variable capacitor in a stepwise manner; an impedance measuring unit for measuring at regular cycles an absolute value and a phase of a load impedance seen from an output terminal of the RF power supply; a first and a second matching control unit for respectively variably controlling the electrostatic capacitances of the first and the second variable capacitor through the first and the second stepwise capacitance varying mechanism such that the measured absolute value and the measured phase of the load impedance obtained by the impedance measuring unit become close to a predetermined reference absolute value and a predetermined reference phase, respectively; an electrostatic capacitance monitoring unit for directly or indirectly monitoring the electrostatic capacitances of the first and the second variable capacitor; and a gain control unit for variably controlling a proportional gain of at least one of the first and the second matching control unit based on the current electrostatic capacitances of the first and the second variable capacitor obtained by the electrostatic capacitance monitoring unit.

The automatic matching apparatus of the second or the third aspect can deal with the case in which hunting easily occurs due to large unbalance generated between the variation of the load impedance per one step in the first feedback control system and the variation of the load impedance per one step in the second feedback control system in accordance with the reactances of the first and the second variable reactance element. In other words, the unbalance of the load impedance variation can be compensated by variably controlling a proportional gain of at least one of the first and the second feedback control system based on the current values of the first and the second variable reactance element. Thus, the hunting can be effectively suppressed in an automatic matching operation. Further, the proportional gain is conditionally varied by the adaptive control, so that unnecessary speed decrease in the matching operation is not caused.

Further, there is provided a plasma processing apparatus including: an evacuable processing chamber accommodating a substrate to be processed; a processing gas supply unit for supplying a desired processing gas into the processing chamber; a plasma generating unit for generating a plasma of the processing gas in the processing chamber by a RF discharge; a RF power supply for outputting a RF power having a predetermined frequency used for the RF discharge; and the automatic matching unit described above, connected between the RF power supply and the plasma generating unit.

Moreover, there is provided a plasma processing apparatus including: an evacuable processing chamber accommodating a substrate to be processed; a processing gas supply unit for supplying a desired processing gas into the processing chamber; a plasma generating unit for generating a plasma of the processing gas in the processing chamber; an electrode for mounting thereon the substrate in the processing chamber; a RF power supply for outputting a RF power having a predetermined frequency used for controlling energy of ions incident onto the substrate on the electrode from the plasma; and the automatic matching unit described above, connected between the RF power supply and the electrode.

In accordance with the automatic matching method, the computer readable storage medium or the automatic matching apparatus of the present invention, the above configurations and operations make it possible to suppress hunting reliably and effectively without causing unnecessary speed decrease in a matching operation.

Further, in accordance with the plasma processing apparatus of the present invention, the automatic matching apparatus of the present invention can improve the functions of generating a plasma by using an RF power and controlling ion attraction and further can improve the reproducibility and the reliability of the plasma process.

DETAILED DESCRIPTION OF THE EMBODIMENT

Embodiments of the present invention will be described with reference to the accompanying drawings which form a part hereof.

Figure 1:
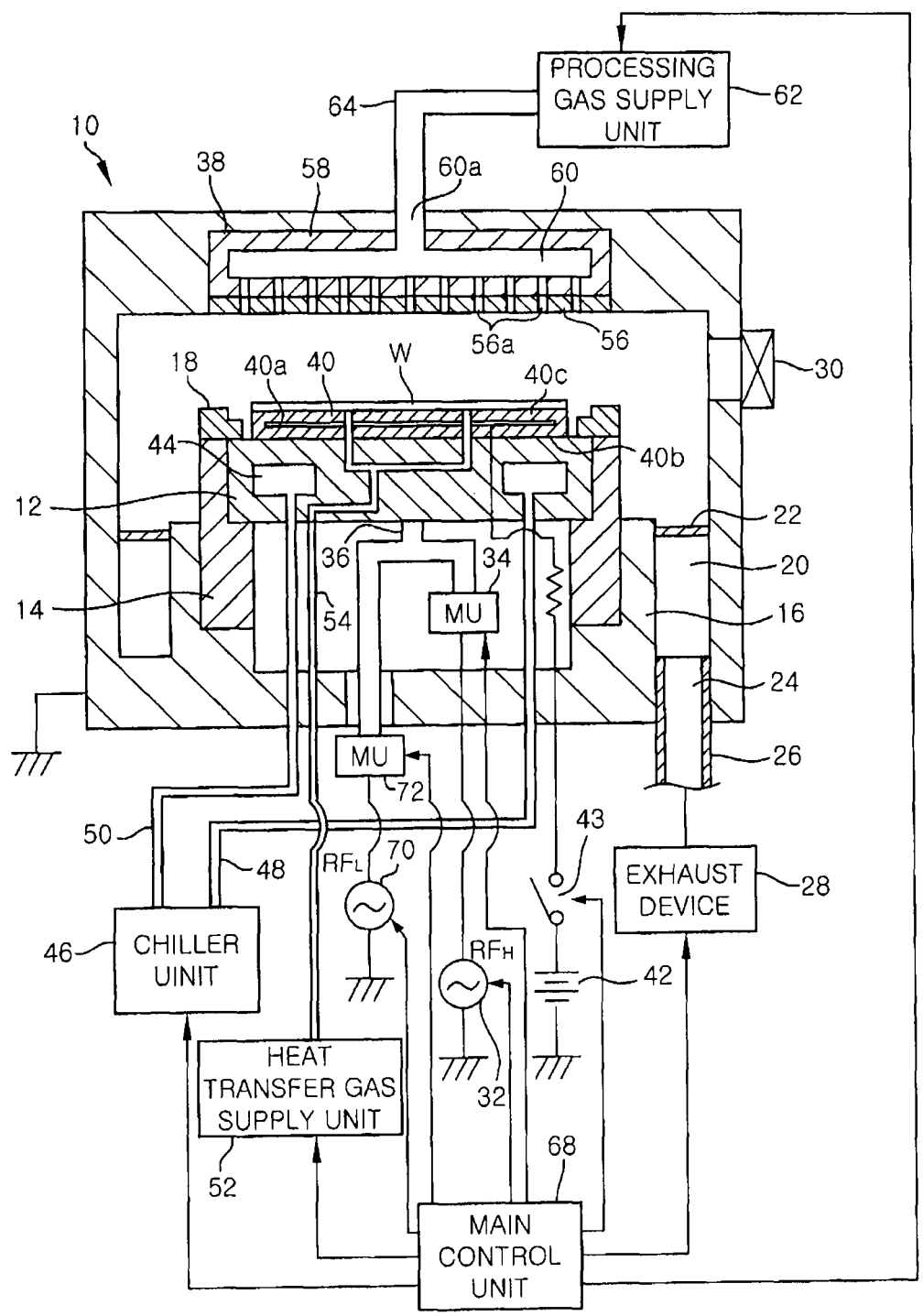
FIG. 1 is a vertical cross sectional view showing a configuration of a plasma processing apparatus in accordance with an embodiment of the present invention.

FIG. 1 shows a configuration of a plasma processing apparatus as an example to which an automatic matching unit of the present invention is applicable. This plasma processing apparatus is configured as a capacitively coupled plasma etching apparatus in which two RF powers are applied to a lower electrode, and includes a cylindrical chamber (processing chamber) 10 made of metal, e.g., aluminum, stainless steel or the like. The chamber 10 is frame grounded.

A circular plate-shaped lower electrode or susceptor for mounting thereon a target substrate, e.g., a semiconductor wafer W, is provided in the chamber 10. The susceptor 12 is made of, e.g., aluminum, and is supported by a cylindrical support 16 extending vertically upward from a bottom of the chamber 10 through an insulating cylindrical supporting portion 14. A focus ring 18 made of, e.g., quartz or silicon, is disposed on the upper surface of the cylindrical supporting portion 14 to annularly surround the top surface of the susceptor 12.

An exhaust path 20 is formed between a sidewall of the chamber 10 and the cylindrical support 16. An annular baffle plate 22 is attached to the entrance or the inside of the exhaust path 20, and an exhaust port 24 is provided at the bottom portion of the chamber 10. An exhaust device 28 is connected to the exhaust port 24 via an exhaust pipe 26. The exhaust device 28 includes a vacuum pump to evacuate a processing space in the chamber 10 to a predetermined vacuum level. Attached to the sidewall of the chamber 10 is a gate valve 30 for opening and closing a loading/unloading port for a semiconductor wafer W.

A first RF power supply 32 for plasma generation is electrically connected to the susceptor 12 via a first matching unit (MU) 34 and a power feed rod 36. The RF power supply 32 outputs a first RF power $RF_H$ having a predetermined frequency of, e.g., about 40 MHz, adequate to generation of a capacitively coupled plasma. The first matching unit 34 matches an impedance between the first RF power supply 32 and the load (mainly, the susceptor, the plasma and the chamber). Further, a shower head 38 to be described later is provided at a ceiling portion of the chamber 10 and serves as an upper electrode of ground potential. Accordingly, the first RF power from the first RF power supply 32 is capacitively applied between the susceptor 12 and the shower head 38.

Moreover, a second RF power supply 70 for ion attraction is electrically connected to the susceptor 12 via a second matching unit 72 and the power feed rod 36. The second RF power supply 70 outputs a second RF power $RF_L$ having a predetermined frequency of, e.g., 3.2 MHz, adequate to control energy of ions attracted toward the semiconductor wafer W on the susceptor 12. The second matching unit 72 matches an impedance between the second RF power supply 70 and the load (mainly, the susceptor, the plasma and the chamber).

An electrostatic chuck 40 is provided on an upper surface of the susceptor 12 to hold the semiconductor wafer W by an electrostatic attraction force. The electrostatic chuck 40 includes an electrode 40a made of a conductive film and a pair of insulating films 40b and 40c. The electrode 40a is interposed between the insulating films 40b and 40c. A DC power supply 42 is electrically connected to the electrode 40a via a switch 43. By applying a DC voltage from the DC power supply 42 to the DC electrode 40a, the semiconductor wafer W can be attracted to and held on the electrostatic chuck 40 by the electrostatic force.

The susceptor 12 has therein a coolant path 44 extending in, e.g., a circumferential direction. A coolant, e.g., cooling water, of a predetermined temperature flows from a chiller unit 46 via lines 48 and 50. By controlling a temperature of the coolant, it is possible to control a processing temperature of the semiconductor wafer W on the electrostatic chuck 40. Moreover, a heat transfer gas, e.g., He gas, is supplied from a heat transfer gas supply unit 52 to a gap between the top surface of the electrostatic chuck 40 and the backside of the semiconductor wafer W via a gas supply line 54.

The shower head 38 provided at the ceiling portion includes an electrode plate 56 having a plurality of gas injection holes 56a on a bottom surface thereof and an electrode holder 58 for holding the electrode plate 56 in an attachable and detachable manner. A buffer space 60 is provided in the electrode holder 58, and a gas supply line 64 from a processing gas supply unit 62 is connected to a gas inlet port 60a of the buffer space 60.

A main control unit 68 controls operations of the respective parts of the plasma etching apparatus, e.g., the exhaust device 28, the first RF power supply 32, the first matching unit 34, the switch 43 for the electrostatic chuck, the chiller unit 46, the heat transfer gas supply unit 52, the processing gas supply unit 62, the second RF power supply unit 70, the second matching unit 72 and the like.

In the plasma etching apparatus, in order to perform the etching, the gate valve 30 is opened first, and a semiconductor wafer W as a target object is loaded into the chamber 10 and mounted on the electrostatic chuck 40. Then, an etching gas (e.g., a gaseous mixture) is supplied from the processing gas supply unit 62 into the chamber 10 at a predetermined flow rate and flow rate ratio. Moreover, the pressure inside the chamber 10 is adjusted to a preset level by the exhaust device 28. Further, the first RF power $RF_H$ having a preset level is supplied from the first RF power supply 32 to the susceptor 12 via the first matching unit 34 and the second RF power $RF_L$ having a preset level is supplied from the second RF power supply 70 to the susceptor via the second matching unit 72.

Moreover, a heat transfer gas (He gas) is supplied from the heat transfer supply unit 52 to a contact interface between the electrostatic chuck 40 and the semiconductor wafer W. Then, a high DC voltage is applied from the DC power supply 42 to the electrode 40a of the electrostatic chuck 40 by turning on the switch 43, so that the heat transfer gas is confined in the contact interface by an electrostatic attraction force of the electrostatic chuck 40. The etching gas injected from the shower head 38 is converted to a plasma by a RF discharge generated between both electrodes 12 and 38. A main surface of the semiconductor W is etched by radicals and/or ions produced in the plasma.

In this plasma etching apparatus, the automatic matching unit of the present invention can be applied to any of the first matching unit 34 included in the RF power supply unit for plasma generation and the second matching unit 72 included in the RF power supply unit for ion attraction.

Therefore, the plasma etching apparatus of the present embodiment can stably and effectively generate a plasma by performing automatic matching with high speed and high accuracy by applying the automatic matching unit of the present invention to the first matching unit 34, and also can stably and effectively control ion attraction by performing automatic matching with high speed and high accuracy by applying the automatic matching unit of the present invention to the second matching unit 72.

Hereinafter, the automatic matching unit of the present invention which is applied to the first matching unit 34 or the second matching unit 72 of the plasma etching apparatus will be described with reference to FIGS. 2 to 10.

Figure 2:
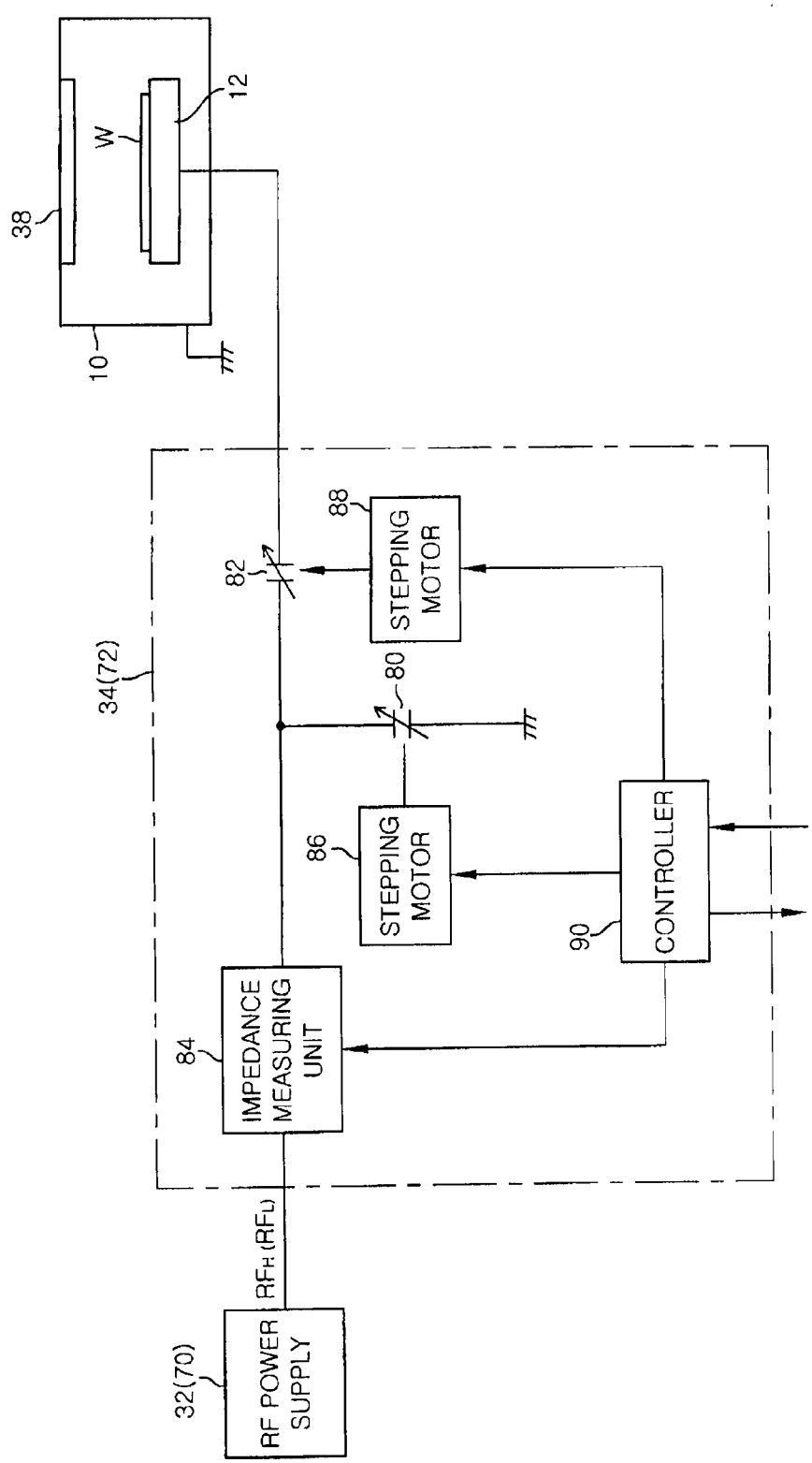
FIG. 2 is a block diagram showing configurations of principal parts of an automatic matching unit in accordance with an embodiment of the present invention which is applied to the plasma processing apparatus.

FIG. 2 shows configurations of principal parts of the automatic matching unit 34 or 72 in accordance with an embodiment of the present invention. The automatic matching unit 34 or 72 includes two variable capacitors 80 and 82 as variable reactance elements in the matching circuit. Here, the first and the second variable capacitor 80 and 82 are connected in parallel and in series to the plasma load on the side of the chamber 10 with respect to the RF power supply 32 or 70.

Further, the matching circuit may include an impedance element, e.g., an inductance coil (not shown), in addition to both variable capacitors 80 and 82. Furthermore, in this plasma etching apparatus in which two RF powers $RF_H$ and $RF_L$ of different frequencies are simultaneously applied to the susceptor 12, a filter circuit (not shown) for blocking a RF power transmitted on a RF transmission line from the load toward the RF power supply 32 or 70 may be provided inside or outside the matching circuit.

The automatic matching unit 34 or 72 has an impedance measuring unit 84, a first and a second stepping motor 86 and 88, and a controller 90 to perform the automatic matching operation.

The impedance measuring unit 84, which is provided at a front end of the matching circuit, measures an RF voltage and an RF current supplied from the RF power supply 32 or 70 to the plasma load, and calculates at regular cycles measured values $ZM_m$ and $Z\theta_m$ of an absolute value ZM and a phase $Z\theta$ (phase difference of the RF voltage and the RF current) of an impedance Z of the load side including the matching circuit from the measured RF voltage value and the measured RF current value.

The controller 90 is configured to variably control electrostatic capacitances $C_1$ and $C_2$ (capacitance positions) of the first and the second variable capacitor 80 and 82 in a stepwise manner through the first and the second stepping motor 86 and 88 serving as the stepwise capacitance varying mechanisms such that the measured absolute value $ZM_m$ and the measured phase $Z\theta_m$ of the load impedance Z obtained by the impedance measuring unit 84 at regular cycles become close to a predetermined reference absolute value $ZM_s$ and a predetermined phase reference value $Z\theta_s$, respectively.

The first and the second variable capacitor 80 and 82 each set capacitance positions of a predetermined number (e.g., 4000 steps) corresponding to electrostatic capacitances of a predetermined range (e.g., about 25 pF to 325 pF) and respectively vary the electrostatic capacitances $C_1$ and $C_2$ within the range of about 25 pF to 325 pF in a stepwise manner by selecting or moving in a stepwise manner the capacitance position between 0 to 4000.

The matching point $Z_s$ in the automatic matching unit 34 or 72 is set to a resistance of about 50Ω ($Z_s=50+j0$) which is equal to the output impedance of the RF power supply 32 or 70. Therefore, $ZM_s$ is 50 and $Z\theta_s$ is 0.

The controller 90 including a microcomputer controls the entire automatic matching operation, and transmits and receives required control signals and data to and from the main control unit 68 (see FIG. 1). The automatic matching unit 34 or 72 of the present embodiment is characterized by the function of the controller 90 in the automatic matching operation.

(First Example of Controller)

Figure 3:
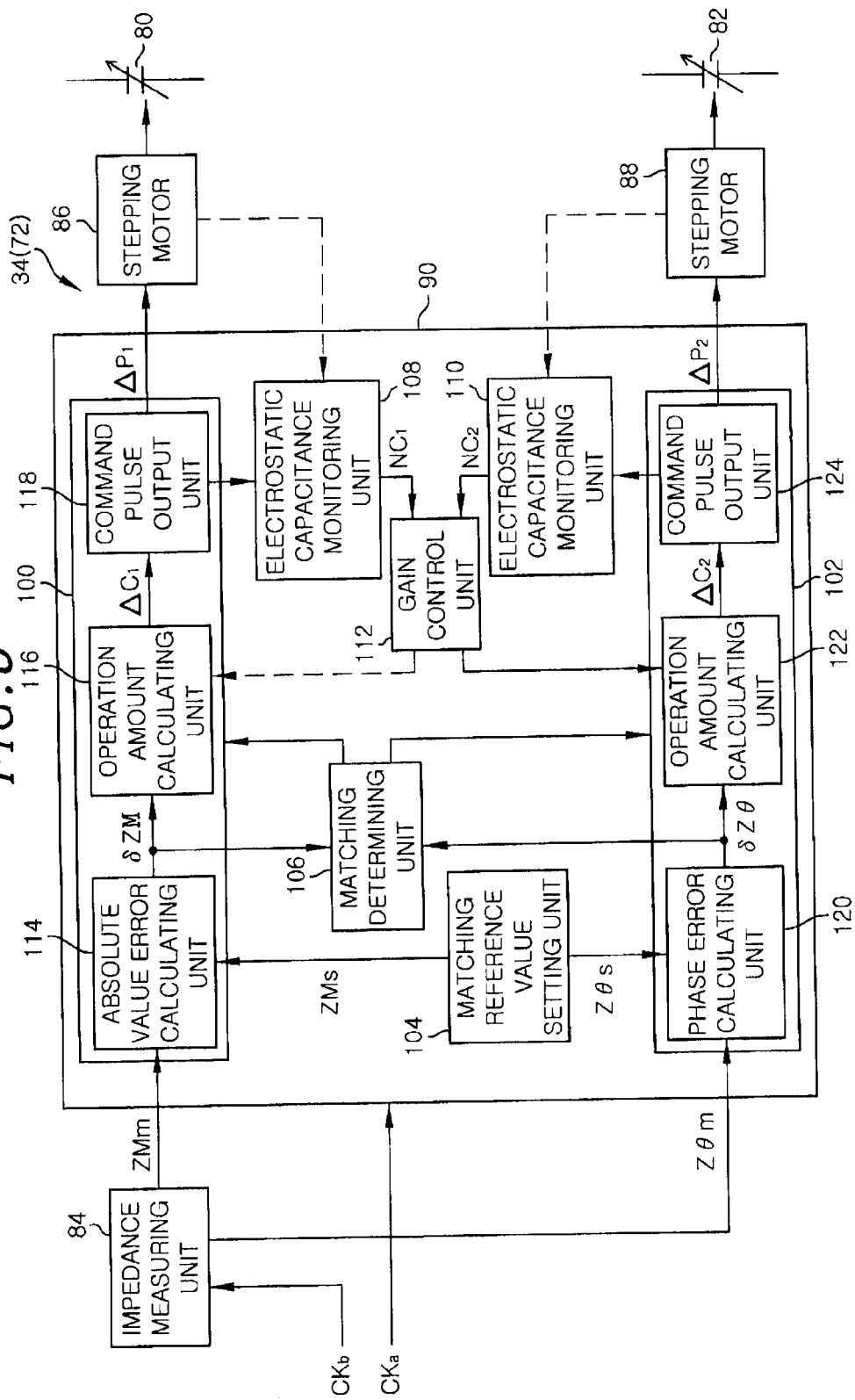
FIG. 3 is a block diagram showing main functions of a controller of a first example.

As shown in FIG. 3, a controller 90 of a first example 1 functionally includes a first and a second matching control unit 100 and 102 of a feedback control system, a matching reference value setting unit 104, a matching determining unit 106, a first and a second electrostatic capacitance monitoring unit 108 and 110, and a gain control unit 112.

The first matching control unit 100 has an absolute value error calculating unit 114, a first operation amount calculating unit 116, and a first command pulse output unit 118.

In the first matching control unit 100, the absolute value error calculating unit 114 inputs the measured absolute value $ZM_m$ of the load impedance obtained by the impedance measuring unit 84 and the reference absolute value $ZM_s$ obtained by the matching reference value setting unit 104, and calculates and outputs an absolute value error $\delta_{ZM}$ corresponding to or in proportion to the difference therebetween ($ZM_s-ZM_m$). The first operation amount calculating unit 116 calculates an operation amount $\Delta C_1$ corresponding to the absolute value error $\delta_{ZM}$ outputted from the absolute value error calculating unit 114.

Here, the operation amount $\Delta C_1$ is obtained by a following equation (1) on the assumption that $K_1$ denotes a proportional gain (proportional sensitivity) of the first matching control unit 100.

$$\Delta C_1 = -K_1 * \delta_{ZM} \qquad \text{Eq. (1)}$$

The first command pulse output unit 118 outputs a command pulse $\Delta P_1$ converted from the operation amount $\Delta C_1$ outputted from the first operation amount calculating unit 116. The first stepping motor 86 rotates by a rotation angle determined by the command pulse $\Delta P_1$, so that the electrostatic capacitance $C_1$ ($C_1$ position) of the first variable capacitor 80 is changed in a stepwise manner by a desired value. Provided between the controller 90 and the first stepping motor 86 is a driving circuit (not shown) for driving the first stepping motor 86 in response to the command pulse $\Delta P_1$ from the first command pulse output unit 118.

The second matching control unit 102 has a phase error calculating unit 120, a second operation amount calculating unit 122, and a second command pulse output unit 124.

In the second matching control unit 102, the phase error calculating unit 120 inputs the measured phase $Z\theta_m$ of the load impedance obtained by the impedance measuring unit and the reference phase $Z\theta_s$ obtained by the matching reference value setting unit 104, and calculates and outputs a phase error $\delta_{Z\theta}$ corresponding to or in proportion to the difference therebetween ($Z\theta_s-Z\theta_m$). The second operation amount calculating unit 122 calculates an operation amount $\Delta C_2$ corresponding to the phase error $\delta_{Z\theta}$ outputted from the phase error calculating unit 120.

Here, the operation amount $\Delta C_2$ is obtained by a following equation (2) on the assumption that $K_2$ denotes a proportional gain of the second matching control unit 102.

$$\Delta C_2 = -K_2 * \delta_{Z\theta} \qquad \text{Eq. (2)}$$

The second command pulse output unit 124 outputs a command pulse $\Delta P_2$ converted from the operation amount $\Delta C_2$ outputted from the second operation amount calculating unit 122. The stepping motor 88 rotates by a rotation angle specified by the command pulse $\Delta P_2$, so that the electrostatic capacitance $C_2$ ($C_2$ position) of the second variable capacitor 82 is changed in a stepwise manner by a desired value. Provided between the controller 90 and the second stepping motor 88 is a driving circuit (not shown) for driving the second stepping motor 88 in response to the command pulse $\Delta P_2$ outputted from the second command pulse output unit 124.

The matching determining unit 106 controls start and stop of the automatic matching operation in the automatic matching unit 34 or 72. In other words, the matching determining unit 106 inputs the absolute value error $\delta_{ZM}$ outputted from the absolute value error calculating unit 114 of the first matching control unit 100 and the phase error $\delta_{Z\theta}$ outputted from the phase error calculating unit 102, and monitors whether or not the absolute value error $\delta_{ZM}$ and the phase error $\delta_{Z\theta}$ are zero or within a predetermined matching range close to zero. If $\delta_{ZM}$ and $\delta_{Z\theta}$ are not within the matching range, the operations of the first and the second matching control unit 100 and 102 are started or continued. On the other hand, if $\delta_{ZM}$ and $\delta_{Z\theta}$ are within the matching range, the operations of the first and the second matching control unit are stopped.

The first and the second electrostatic capacitance monitoring unit 108 and 110 respectively monitor current values $NC_1$ and $NC_2$ of the electrostatic capacitances $C_1$ and $C_2$ of the first and the second variable capacitor 80 and 82. In the present embodiment, the current capacitance positions of the first and the second stepping motor 86 and 88 are respectively obtained by counting (counting up or counting down) the command pulses $\Delta P_1$ and $LP_2$ outputted from the first and the second command pulse output unit 118 and 124 toward the first and the second stepping motor 86 and 88, and the current electrostatic capacitances $NC_1$ and $NC_2$ corresponding thereto are obtained from the current capacitance positions. In another example, the rotation angles of the first and the second stepping motor 86 and 88 may be monitored through an encoder (not shown), and the current capacitance positions and further the current electrostatic capacitances $NC_1$ and $NC_2$ of the first and the second variable capacitor 80 and 82 may be monitored based on the rotation angles of the motors.

The gain control unit 112 variably controls at least one of the proportional gains $K_1$ and $K_2$ of the first and the second matching control unit 100 and 102 based on the current electrostatic capacitances of the first and the second variable capacitor 80 and 82 respectively obtained by the first and the second electrostatic capacitance monitoring unit 108 and 110.

In the automatic matching unit 34 or 72 of the present embodiment, the gain control unit 112 performs gain variable control such that the proportional gain of the second matching control unit 102 is relatively decreased compared to that of the first matching control unit 100. In general, the adaptive control is performed such that the proportional gain $K_2$ of the second matching control unit 102 is decreased properly while the proportional gain $K_1$ of the first matching control unit 100 is fixed.

Further, the controller 90 and the impedance measuring unit 84 receive predetermined clock signals $CK_a$ and $CK_b$ from a clock circuit (not shown) and operate at predetermined cycles based on the clock signals $CK_a$ and $CK_b$.

Here, FIGS. 4A to 5E provide graphs showing the relationship between the variation of the load impedance Z and the electrostatic capacitances $C_1$ and $C_2$ of the first and the second variable capacitor 80 and 82 near the matching point. These graphs are obtained by simulation and used for the gain variable control of the gain control unit 112. In the drawings, $dZM/dC_1$ and $dZ\theta/dC_1$ respectively denote the variations of the absolute value and the phase of the load impedance in the case of varying $C_1$ by one step. Further, $dZM/dC_2$ and $dZ\theta/dC_2$ respectively denote variations of the absolute value and the phase of the load impedance in the case of varying $C_2$ by one step.

The graphs in FIGS. 4A to 4E show the load impedance variation characteristics in the case of varying the capacitance position ($C_1$ position) of the first variable capacitor 80 between 0 to 4000 while fixing the capacitance position ($C_2$ position) of the second variable capacitor 82 to 0, 1000, 2000, 3000 and 4000, respectively.

Meanwhile, the graphs in FIGS. 5A to 5E show the load impedance variation characteristics in the case of varying the capacitance position ($C_2$ position) of the second variable capacitor 82 between about 0 to 4000 while fixing the capacitance position ($C_1$ position) of the first variable capacitor 80 to 4000, 3000, 2000, 1000 and 0, respectively.

These graphs show that, in the vicinity of the matching point, i.e., as the load impedance Z becomes close to the matching point $Z_s$ in the matching operation, the load impedance variations ($dZM/dC_1$, $dZ\theta/dC_1$, $dZM/dC_2$, $dZ\theta/dC_2$) have a large deviation depending on the electrostatic capacitances $C_1$ and $C_2$ of the first and the second variable capacitor 80 and 82 at that time, i.e., the current electrostatic capacitances $NC_1$ and $NC_2$.

In other words, $dZM/dC_1$ and $dZ\theta/dC_1$ are constantly and stably smaller than or equal to about 1 regardless of the values of the electrostatic capacitances $C_1$ and $C_2$ of the first and the second variable capacitor 80 and 82 within the variable range. However, as the electrostatic capacitance $C_2$ of the second variable capacitor 82 becomes close to a minimum value ($C_2$ position=0) and as the electrostatic capacitance $C_1$ of the first variable capacitor 80 becomes close to a maximum value ($C_1$ position=4000), $dZ\theta/dC_2$ is remarkably increased (more than several tens of times) and $dZM/dC_2$ is increased (more than several time) by an amount smaller than that of $dZ\theta/dC_2$, as can be seen from the graphs shown in FIG. 4A and FIG. 5A. It should be noted that both of $dZ\theta/dC_2$ and $dZM/dC_2$ are stably smaller than or equal to about 1 as the electrostatic capacitance $C_2$ of the second variable capacitor 82 becomes close to a maximum value ($C_2$ position=4000) and as the electrostatic capacitance $C_1$ of the first variable capacitor 80 becomes close to a minimum value ($C_1$ position=0).

As described above, when $dZ\theta/dC_2$ and $dZM/dC_2$ are remarkably greater than $dZM/dC_1$ and $dZ\theta/dC_1$, the variation of the load impedance Z in the case of varying the electrostatic capacitance $C_2$ of the second capacitor 82 by a minute amount is increased remarkably compared to the variation of the load impedance Z in the case of varying the electrostatic capacitance $C_1$ of the first capacitor 80 by the same minute amount. In other words, there occurs an unbalance between the pitch for moving the load impedance Z toward the matching point $Z_s$ by the feedback control operation of the first matching control unit 100 and the pitch for moving the load impedance Z toward the matching point $Z_s$ by the feedback control operation of the second matching control unit 102, which may result in hunting.

In order to solve the above problem, in the present embodiment, the electrostatic capacitance monitoring units 108 and 110 obtain the current electrostatic capacitances $NC_1$ and $NC_2$ by monitoring the electrostatic capacitances $C_1$ and $C_2$ of the first and the second variable capacitor 80 and 82, and the gain control unit 112 corrects the proportional gain $K_2$ of the second matching control unit 102 based on the current electrostatic capacitances $NC_1$ and $NC_2$.

Specifically, the gain control unit 112 corrects (variably controls) the proportional gain $K_2$ of the second matching control unit 102 as indicated by a following equation (3).

$$K_2 \Rightarrow K_2 * (\alpha * NC_2^x / NC_1^y) \qquad \text{Eq. (3)}$$

where, $\alpha$ indicates a proportional coefficient, and x and y satisfy $0 \leq x \leq 2$ and $0 \leq y \leq 2$.

For example, when x and y are respectively 2, a following equation (4) is obtained.

$$K_2 \Rightarrow K_2 * (\alpha * NC_2^2 / NC_1^2) \qquad \text{Eq. (4)}$$

Figure 6A:
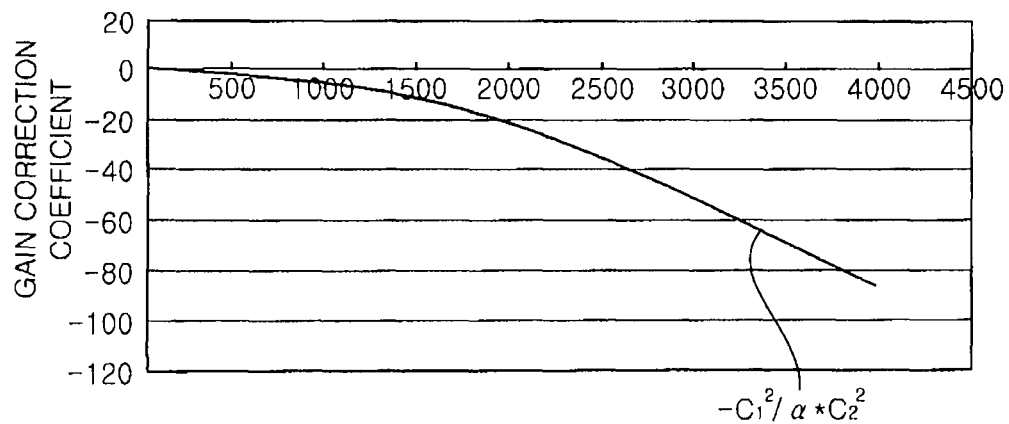
FIG. 6A is a graph showing $-C_1^2/\alpha^* C_2^2$ characteristics in the automatic matching unit in which $C_1$ is varied while $C_2$ is fixed.

FIG. 6A shows $-C_1^2/\alpha * C_2^2$ characteristics in the case of varying the capacitance position ($C_1$ position) of the first variable capacitor 80 between 0 to 4000 while fixing the capacitance position ($C_2$ position) of the second variable capacitor 82 to zero. Moreover, FIG. 6B shows $-C_1^2/\alpha * C_2^2$ characteristics in the case of varying the electrostatic position ($C_2$ position) between 0 to 4000 while fixing the capacitance position ($C_1$ position) of the first variable capacitor 80 to about 4000.

Figure 4A:
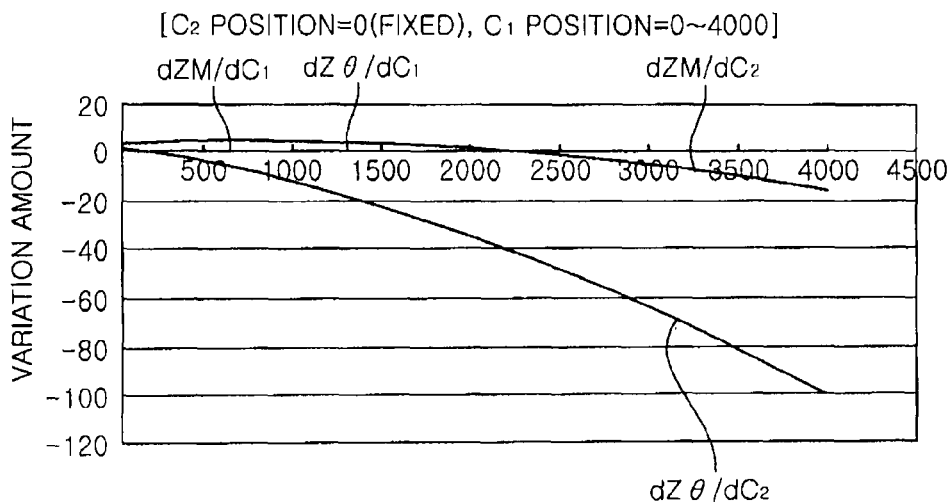
FIGS. 4A to 4E are graphs showing load impedance variation characteristics in the automatic matching unit in which $C_1$ is varied while $C_2$ is fixed.
Figure 4B:
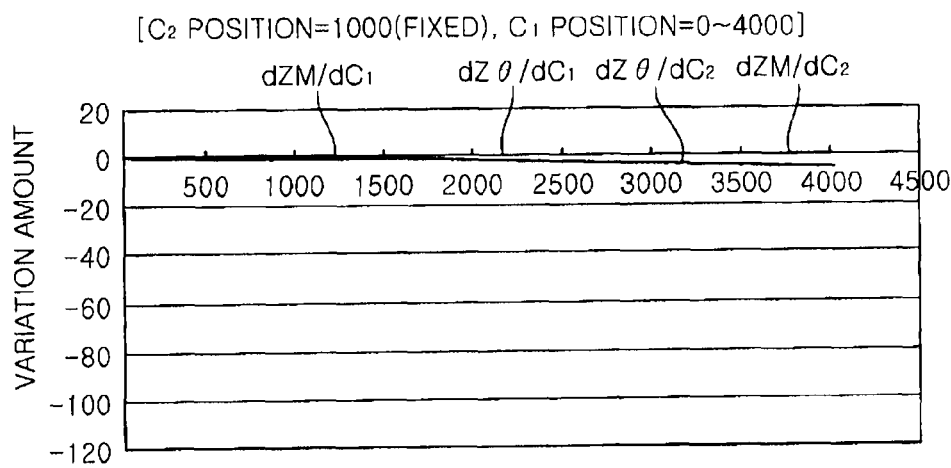
Figure 4C:
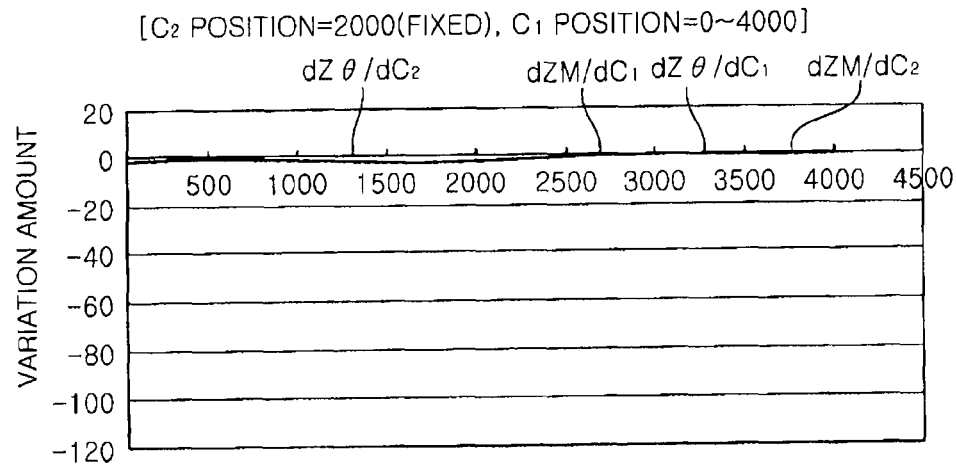
Figure 4D:
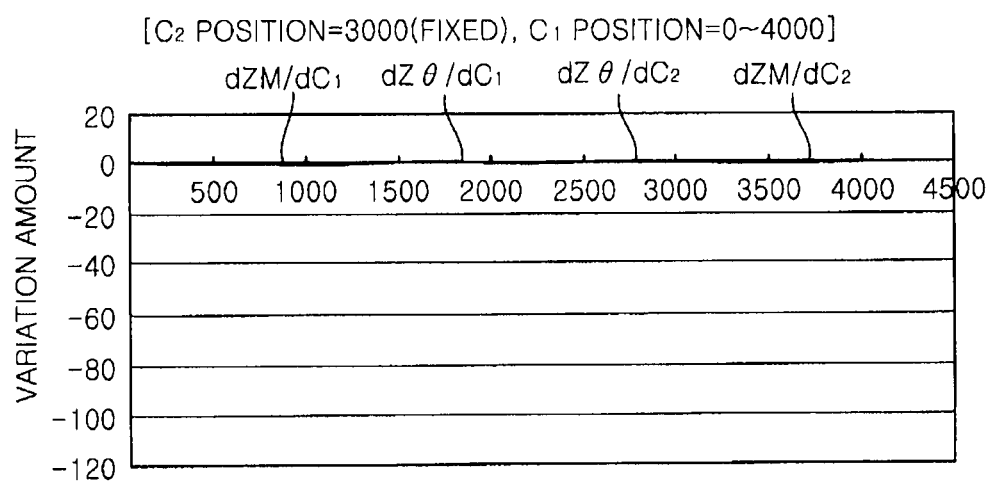
Figure 4E:
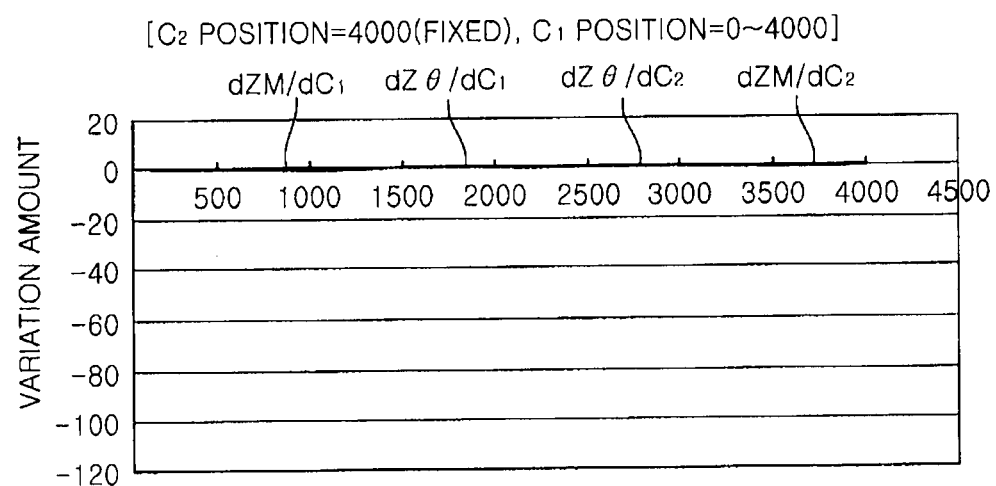
Figure 5A:
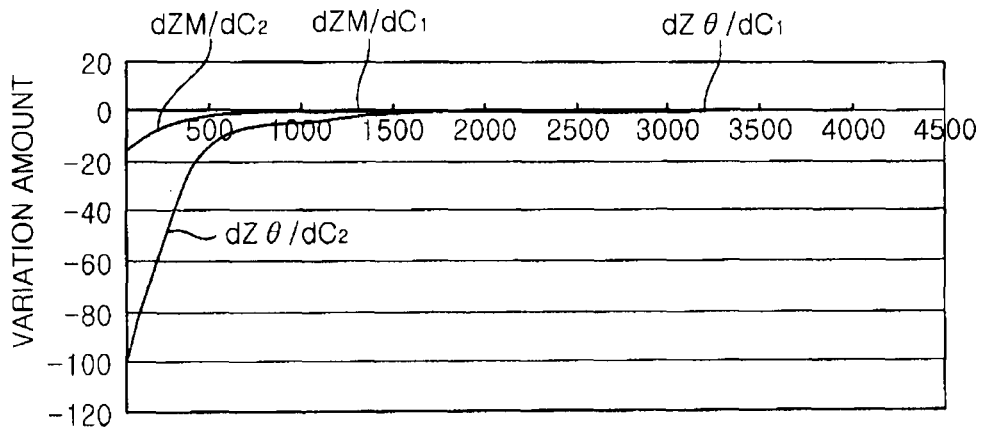
FIGS. 5A to 5E are graphs showing load impedance variation characteristics in the automatic matching unit in which $C_1$ is fixed while $C_2$ is varied.
Figure 5B:
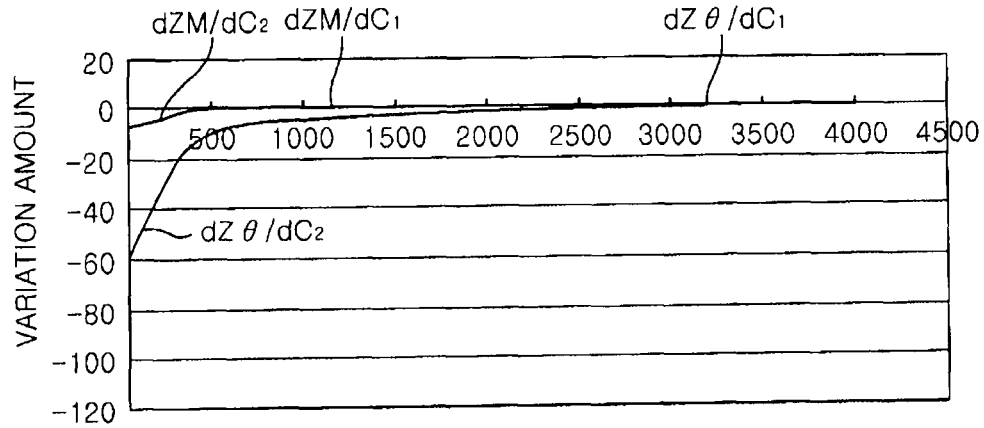
Figure 5C:
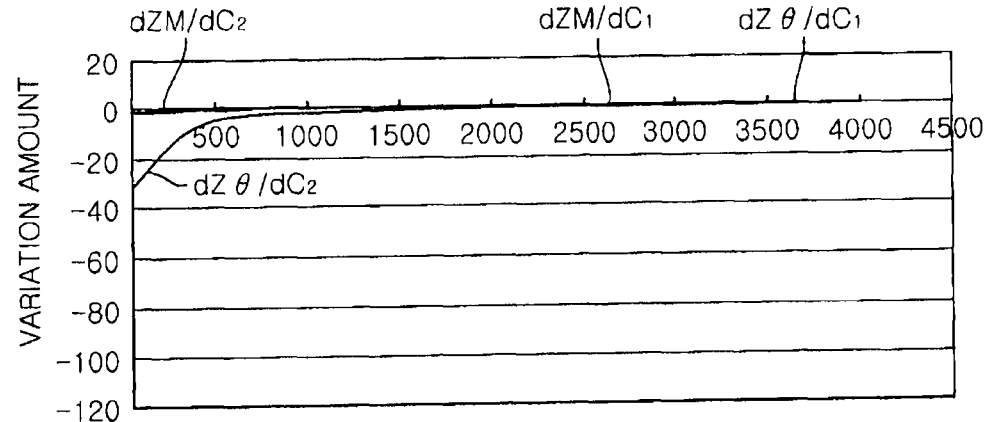
Figure 5D:
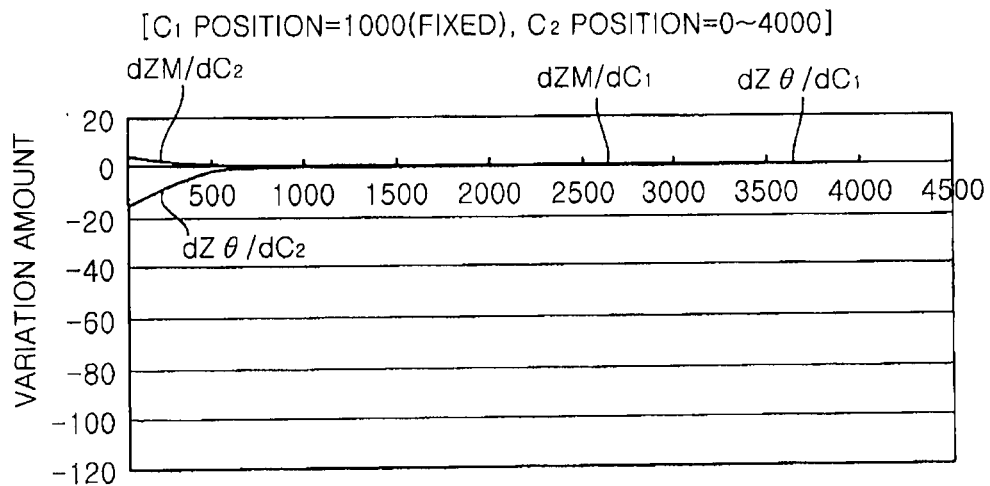
Figure 5E:
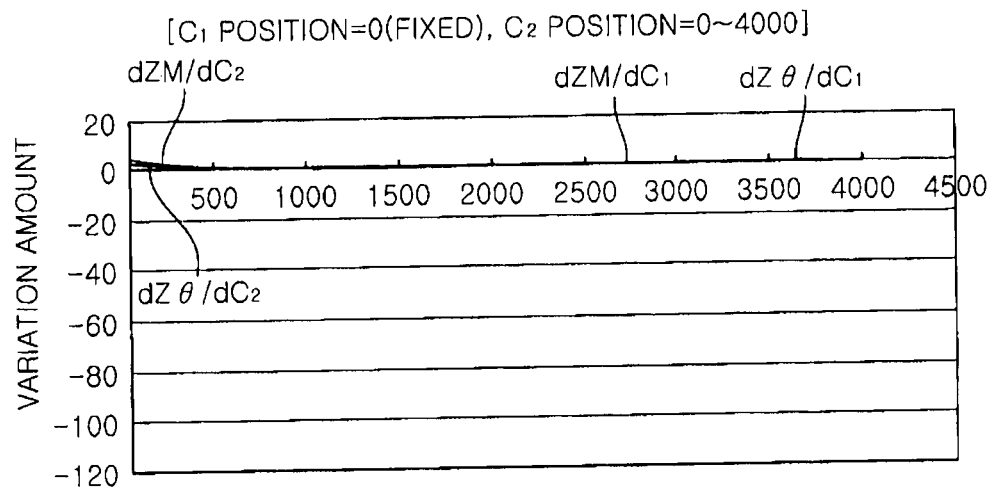
Figure 6B:
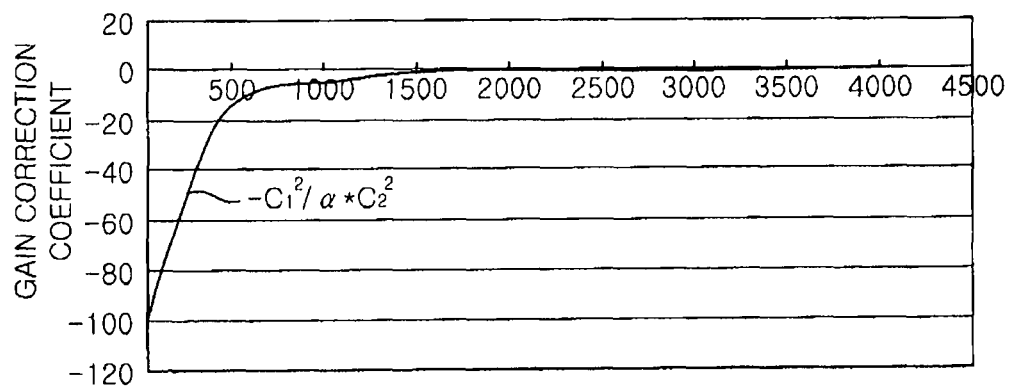
FIG. 6B is a graph showing $-C_1^2/\alpha^* C_2^2$ characteristics in the automatic matching unit in which $C_1$ is fixed while $C_2$ is varied.

It seems that the $-C_1^2/\alpha * C_2^2$ characteristics of FIGS. 6A and 6B are similar to the $dZ\theta/dC_2$ characteristics of FIGS. 4A and 5A. Therefore, by performing correction in which the proportional gain $K_2$ of the second matching control unit 102 is divided by the gain correction coefficient $NC_1^2/\alpha * NC_2^2$, the $dZ\theta/dC_2$ characteristics of FIGS. 4A and 5A can be canceled by the $-C_1^2/\alpha * C_2^2$ characteristics of FIGS. 6A and 6B.

Moreover, the $dZM/dC_2$ characteristics deteriorate remarkably by applying the above-described gain correction (variable control) to the second matching control unit 102. However, since the matter is not the absolute values of $dZM/dC_2$ and $dZ\theta/dC_2$ but relative changes thereof, it is preferable that the curved lines of both functions be similar to each other (actually, they are substantially similar to each other.)

Besides, when the gain correction (variable control) is constantly applied to the second matching control unit 102, it seems that the electrostatic capacitance $C_1$ of the first variable capacitor 80 becomes close to the minimum value ($C_1$ position=0) in the range where the load impedance variation $dZ\theta/dC_2$ or $dZM/dC_2$ is not considerably large and the proportional gain $K_2$ is increased when the electrostatic capacitance $C_2$ of the second variable capacitor 82 becomes close to the maximum value ($C_2$ position=4000). However, this is relative, and can be arbitrarily adjusted by selecting the proportional coefficient $\alpha$. For example, the maximum value of $C_2^2/C_1^2$ is $325^2/25^2 = 13^2$, so that correction of about 1 or less can be constantly applied to the proportional gain $K_2$ by setting $\alpha$ to $1/13^2$.

It should be noted that the gain correction (variable control) can be conditionally applied to the second matching control unit 102. For example, proper threshold values may be set for the current electrostatic capacitances $NC_1$ and $NC_2$ of the first and the second variable capacitor 80 and 82, and the gain control unit 112 may apply the above-described gain correction (variable control) to the second matching control unit 102 only in the range where the $C_1$ position and the $C_2$ position satisfy $C_1$ position≥1000 and $C_2$ position≥1000 in the graphs of FIGS. 4A to 5E.

Further, the above-described gain correction (variable control) can be performed after the load impedance Z becomes within a predetermined proximity range of the matching point $Z_s$. In that case, the matching determining unit 106 can set a threshold value of the proximity range and determine the start of the gain variable control.

As described above, in the first embodiment, the proportional gain $K_2$ of the second matching control unit 102 is decreased when the electrostatic monitoring units 108 and 110 and the gain control unit 112 apply to the second matching control unit 102 the gain correction (variable control) based on the current electrostatic capacitances $NC_1$ and $NC_2$ of the first and the second variable capacitor 80 and 82. Therefore, the operation amount $\Delta C_2$ outputted from the second operation amount unit 122 is decreased, and the number of command pulses per unit time outputted from the second command pulse output unit 124 is decreased. Accordingly, the variation per unit time in which the load impedance Z is varied toward the matching point $Z_s$ by the second matching control unit 102 is reduced and balanced with the variation per unit time in which the load impedance Z is varied toward the matching point $Z_s$ by the first matching control unit 100. As a result, hunting hardly occurs.

In addition, in the first embodiment, the proportional gain $K_2$ of the second matching control unit 102 is decreased based on the current electrostatic capacitances $NC_1$ and $NC_2$ of the first and the second variable capacitor 80 and 82, i.e., by the adaptive control. Hence, unnecessary speed decrease in a matching operation is not caused.

(Second Example of Controller)

Hereinafter, the function of the controller 90 of a second example will be described with reference to FIGS. 7A to 10.

In the first example, the first and the second capacitor 80 and 82 are orthogonally and variably controlled such that the absolute value error $\delta_{ZM}$ and the phase error $\delta_{Z\theta}$ of the load impedance Z become close to zero. However, in the orthogonal automatic matching, the control of the load impedance does not accord with the operation states of the variable capacitors.

In other words, actually, as shown in FIGS. 4A to 5E, the first variable capacitor 80 affects the phase $Z\theta$ as well as the absolute value ZM of the load impedance Z, and the second variable capacitor 82 affects the absolute value ZM as well as the phase $Z\theta$ of the load impedance Z. Therefore, if the capacitance position $C_1$ ($C_1$ position) of the first variable capacitor 80 is varied such that the absolute value error $\delta_{ZM}$ becomes close to zero, the operating point of the load impedance Z becomes close to the matching point in view of the absolute value but may become distant from the matching point $Z_s$ in view of the phase. Meanwhile, if the capacitance position $C_2$ ($C_2$ position) of the second capacitor 82 is varied such that the phase error $\delta_{Z\theta}$ becomes close to zero, the operating point of the load impedance Z becomes close to the matching point $Z_s$ in view of the phase but may become distant from the matching point $Z_s$ in view of the absolute value. Hence, the orthogonal automatic matching requires a comparatively long period of time until the operating point of the load impedance Z becomes close to the matching point $Z_s$ or until the matching is completed.

In the second embodiment, as will be described later, the matching algorithm enables the phase $Z\theta$ and the absolute value ZM of the load impedance Z to be changed by varying the electrostatic capacitances $C_1$ and $C_2$ ($C_1$ position and $C_2$ position) of the first and the second variable capacitor 80 and 82.

Here, the matching algorithm of the second example will be described. The controller 90 can make an impedance coordinate system having two orthogonal axes of the phase $Z\theta$ and the absolute value ZM of the load impedance Z in a software manner. Further, as needed, the controller 90 can detect the matching point $Z_s$ indicated by coordinates of the reference absolute value $ZM_s$ and the reference phase $Z\theta_s$ and the operating point $Z_p$ indicated by coordinates of the reference absolute value $ZM_m$ and the reference phase $Z\theta_m$ on the impedance coordinates. Here, the operating point $Z_p$ corresponds to the current electrostatic capacitances $NC_1$ and $NC_2$ of the first and the second variable capacitor 80 and 82.

First of all, the basic operation of moving the operating point $Z_p$ on the impedance coordinates will be described. In the second example, there are defined variations $\delta ZM_1$ and $\delta Z\theta_1$ of the absolute value ZM and the phase $Z\theta$ of the load impedance Z in the case of varying the electrostatic capacitance $C_1$ ($C_1$ position) of the first variable capacitor 80 by one step and variations $\delta ZM_2$ and $\delta Z\theta_2$ of the absolute value ZM and the phase $Z\theta$ of the load impedance Z in the case of varying the electrostatic capacitance $C_2$ ($C_2$ position) of the second variable capacitor 82 by one step.

When the electrostatic capacitance $C_1$ ($C_1$ position) of the first variable capacitor 80 is arbitrarily varied on the impedance coordinates, the operating point $Z_p$ moves on a linear line having first inclination $R_1$ ($R_1 = \delta Z\theta_1/\delta ZM_1$). When the electrostatic capacitance $C_2$ ($C_2$ position) of the second variable capacitor 82 is arbitrarily varied, the operating point $Z_p$ moves on a linear line having second inclination $R_2$ ($R_2 = \delta Z\theta_2/\delta ZM_2$).

Here, when the electrostatic capacitance $C_1$ and $C_2$ ($C_1$ and $C_2$ positions) of the first and the second variable capacitor 80 and 82 are varied by one step, the operating point $Z_p$ can move on the impedance coordinates in four patterns shown in FIGS. 7A to 7D. Further, the variation of the phase $Z\theta$ and the absolute value ZM of the load impedance Z with respect to $C_1$ and $C_2$ is negative. In other words, when $C_1$ and $C_2$ are varied by one step (+1) in the positive direction, the operating point $Z_p$ moves in a direction that the measured absolute value $ZM_m$ and the measured phase $Z\theta_m$ are decreased. When $C_1$ and $C_2$ are varied by one step (−1) in the negative direction, the operating point $Z_p$ moves in a direction that the measured absolute value $ZM_m$ and the measured phase $Z\theta_m$ are increased. Further, $C_1$ is first varied by one step and, then, $C_2$ is varied by one step.

Figure 7A:
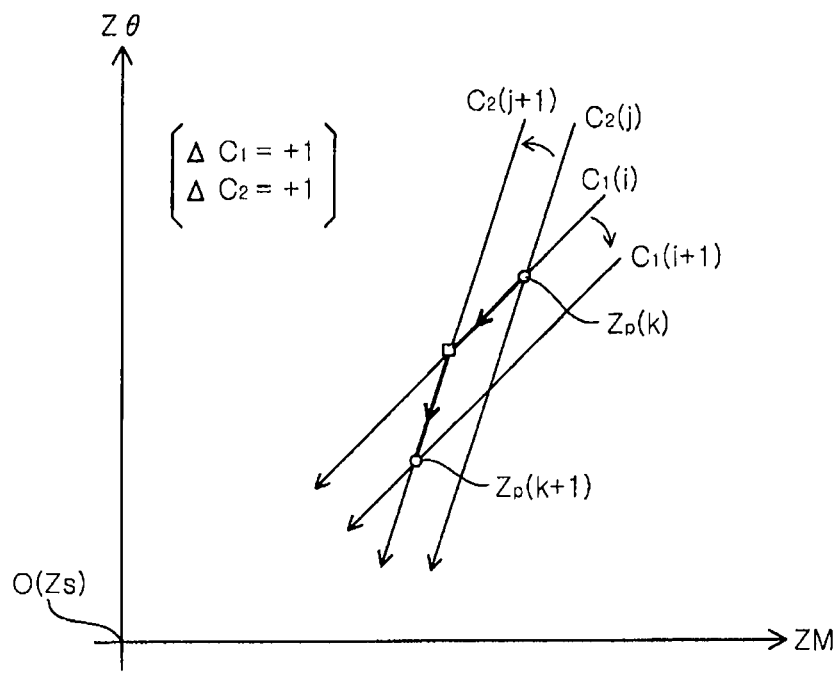
FIGS. 7A to 7D respectively show first to fourth basic movement patterns for moving an operating point in a matching algorithm in a second example.

FIG. 7A shows the case of varying $C_1$ by +1 and $C_2$ by +1 ($\Delta C_1 = +1$, $\Delta C_2 = +1$). When $C_1$ is varied by +1, the $C_2$ coordinate axis is moved by one pitch from $C_2(j)$ to $C_2(j+1)$ positioned in a left upper side. When $C_2$ is varied by +1, the $C_1$ coordinate axis is moved by one pitch from $C_1(i)$ to $C_1(i+1)$ positioned in a right lower side, and the operating point moves from the intersection point $Z_p(k)$ between $C_1(i)$ and $C_2(j)$ to the intersection point $Z_p(k+1)$ between $C_1(i+1)$ and $C_2(j+1)$.

Figure 7B:
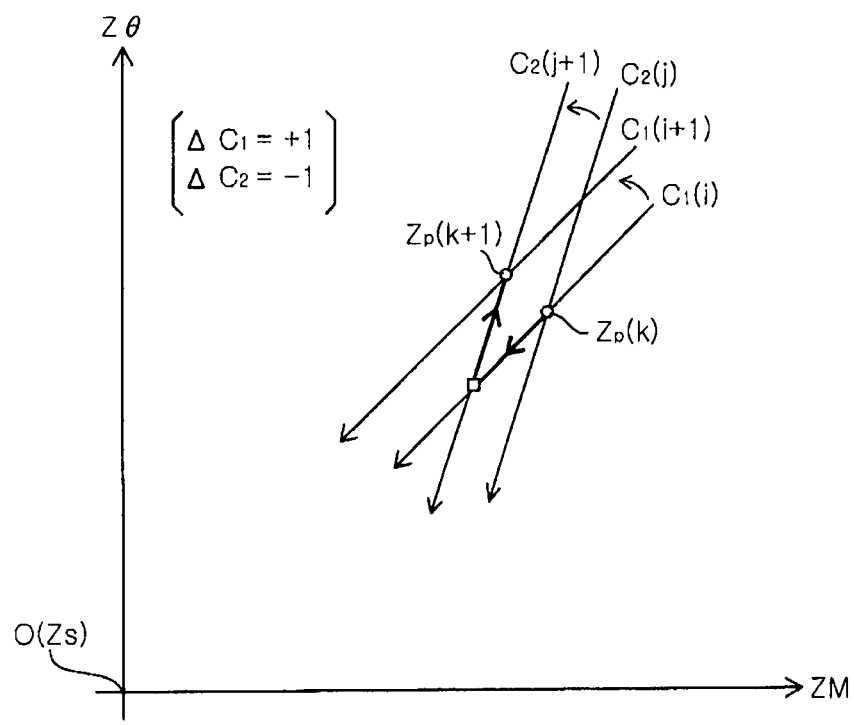

FIG. 7B shows the case of varying $C_1$ by +1 and $C_2$ by −1 ($\Delta C_1 = +1$, $\Delta C_2 = -1$). When $C_1$ is varied by +1, the $C_2$ coordinate axis is moved by one pitch from $C_2(j)$ to $C_2(j+1)$ positioned in a left upper side. When $C_2$ is varied by −1, the $C_1$ coordinate axis is moved by one pitch from $C_1(i)$ to $C_1(i+1)$ positioned in a left upper side, and the operating point moves from the intersection point $Z_p(k)$ between $C_1(i)$ and $C_2(j)$ to the intersection point $Z_p(k+1)$ between $C_1(i+1)$ and $C_2(j+1)$.

Figure 7C:
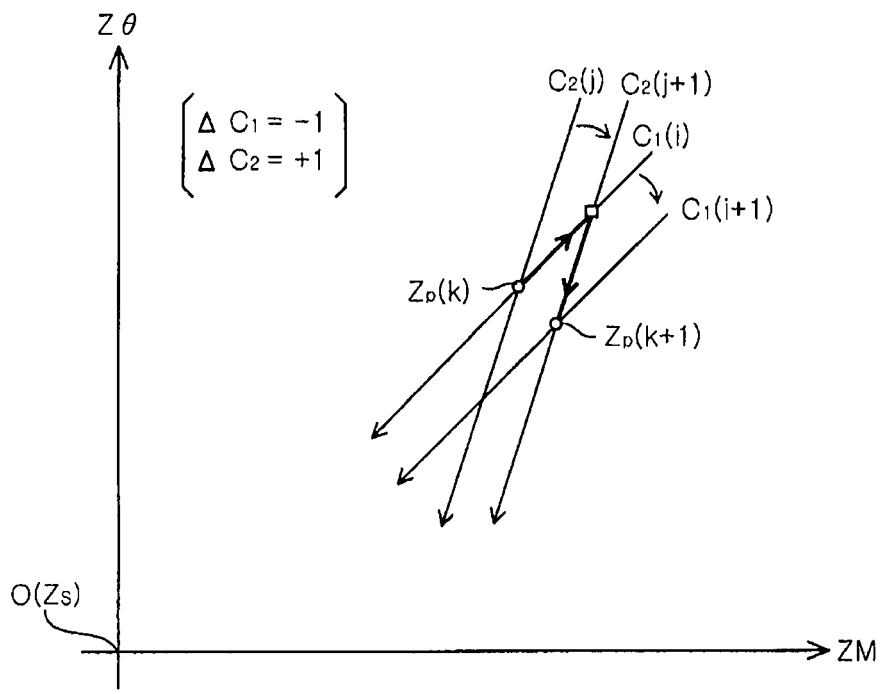

FIG. 7C shows the case of varying $C_1$ by −1 and $C_2$ by +1 ($\Delta C_1 = -1$, $\Delta C_2 = +1$). When $C_1$ is varied by −1, the $C_2$ coordinate axis is moved by one pitch from $C_2(j)$ to $C_2(j+1)$ positioned in a right lower side. When $C_2$ is varied by +1, the $C_1$ coordinate axis is moved by one pitch from $C_1(i)$ to $C_1(i+1)$ positioned in a right lower side, and the operating point moves from the intersection point $Z_p(k)$ between $C_1(i)$ and $C_2(j)$ to the intersection point $Z_p(k+1)$ between $C_1(i+1)$ and $C_2(j+1)$.

Figure 7D:
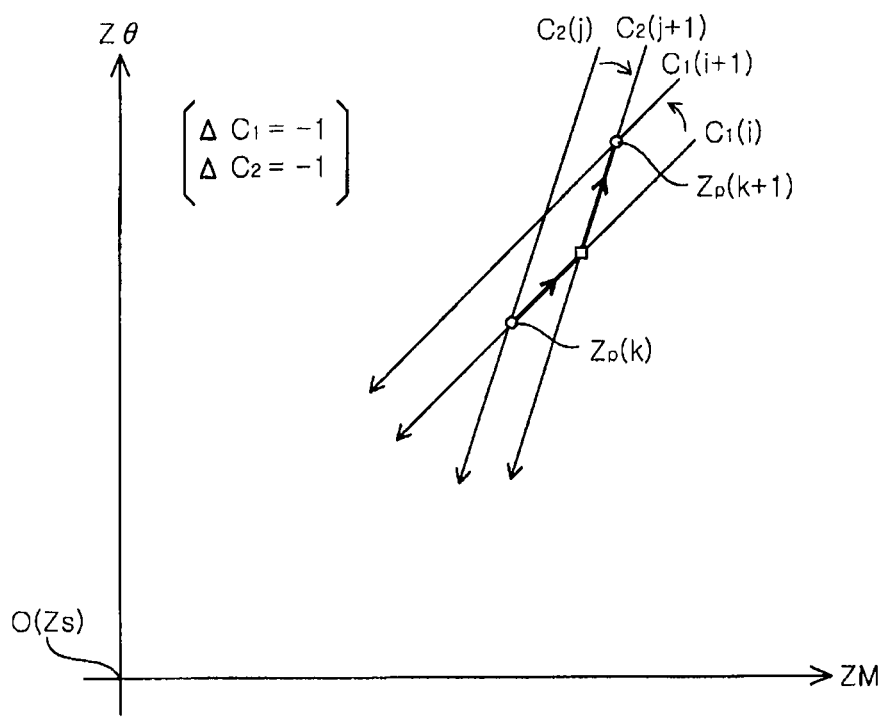

FIG. 7D shows the case of varying $C_1$ by −1 and $C_2$ by −1 ($\Delta C_1=-1$, $\Delta C_2=-1$). When $C_1$ is varied by −1, the $C_2$ coordinate axis is moved by one pitch from $C_2(j)$ to $C_2(j+1)$ positioned in a right lower side. When $C_2$ is varied by +1, the $C_1$ coordinate axis is moved by one pitch from $C_1(i)$ to $C_1(i+1)$ positioned in a left upper side, and the operating point moves from the intersection point $Z_p(k)$ between $C_1(i)$ and $C_2(j)$ to the intersection point $Z_p(k+1)$ between $C_1(i+1)$ and $C_2(j+1)$.

Figure 8:
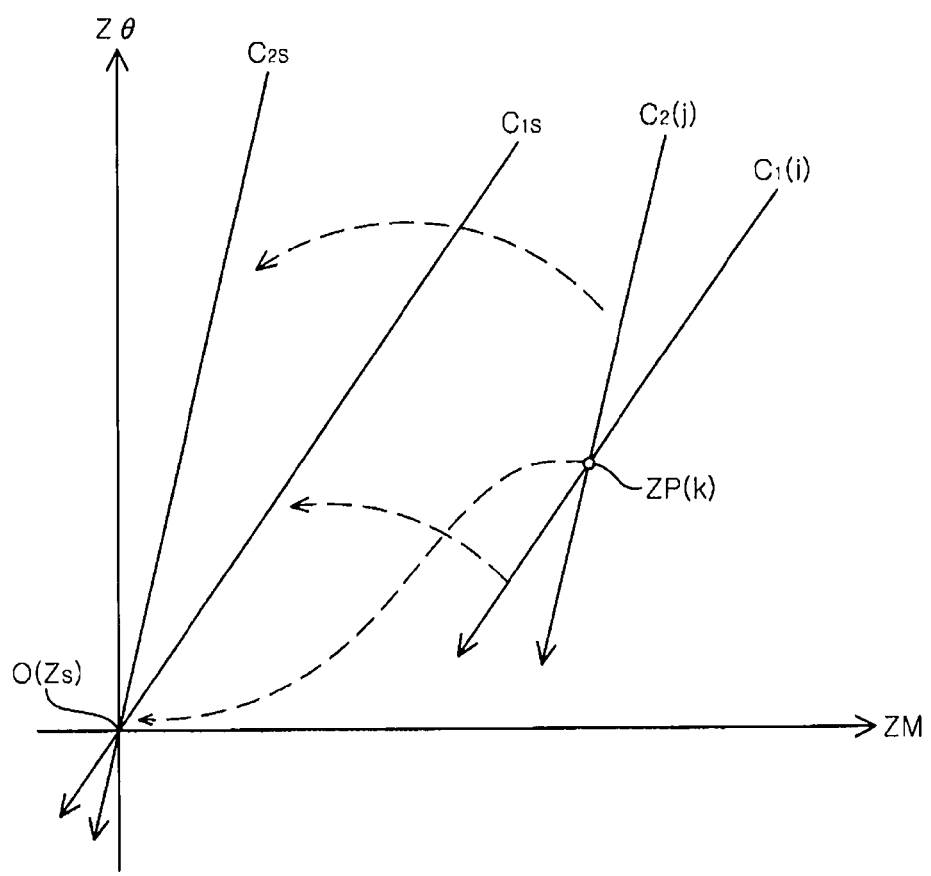
FIG. 8 schematically illustrates a method of the matching algorithm.

The matching algorithm of the second example uses the second pattern (FIG. 7B) among the above four basic movement patterns (FIGS. 7A to 7D) for moving the operating point $Z_p$. In other words, as shown in FIG. 8, when the $C_1$ coordinate axis and the $C_2$ coordinate axis pass through the origin O (matching point $Z_s$), the operating point $Z_p$ coincides with the matching point $Z_s$ and the complete matching state is obtained. Therefore, in this matching algorithm, the $C_1$ coordinate axis and the $C_2$ coordinate axis passing through the origin O (matching point $Z_s$) are respectively set as the first and the second reference line $C_{1S}$ and $C_{2S}$. Further, $C_2$ is varied by one step at regular cycles in a direction that the current $C_1$ coordinate axis $C_1(i)$ (further the operating point $Z_p$) becomes close to the first reference line $C_{1S}$, and $C_1$ is varied by one step at regular cycles in a direction that the current $C_2$ coordinate axis $C_2(j)$ (further the operating point $Z_p$) becomes close to the second reference line $C_{2S}$. To do so, it is preferable to use the second basic movement pattern ($\Delta C_1=+1$, $\Delta C_2=-1$) (FIG. 7B).

This basic movement pattern ($\Delta C_1=+1$, $\Delta C_2=-1$) uses the following calculation equations (1) and (2) as control logic.

$$\Delta C_1 = [R_2 \cdot ZM - Z\theta] = \pm 1 \quad \text{Eq. (5)}$$

$$\Delta C_2 = [-R_1 \cdot ZM + Z\theta] = \pm 1 \quad \text{Eq. (6)}$$

Figure 9A:
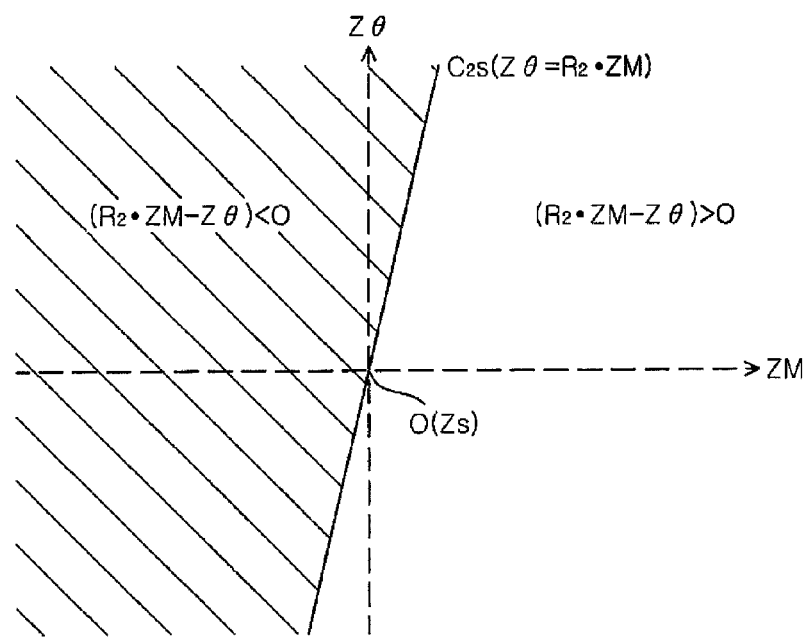
FIGS. 9A and 9B explain control logics used in the matching algorithm by illustration.

Here, the calculation equation (5) indicates that when $R_2 \cdot ZM - Z\theta$ has a positive value, $\Delta C_1$ becomes +1, whereas when $R_2 \cdot ZM - Z\theta$ has a negative value, $\Delta C_1$ becomes −1. In other words, as shown in FIG. 9A, when the operating point $Z_p$ is within the right plane region of two regions (plane region/shaded region) divided by the second reference line $C_{2S}$ on the impedance coordinates, $R_2 \cdot ZM - Z\theta$ has a positive value and $C_1$ is varied by one step based on $\Delta C_1=+1$. On the other hand, when the operating point $Z_p$ is within the left shaded region, $R_2 \cdot ZM - Z\theta$ has a negative value and $C_1$ is varied by one step based on $\Delta C_1=-1$. In both cases, when $C_1$ is varied by one step, the current $C_2$ coordinate axis $C_2(j)$ is moved by one pitch toward the second reference line $C_{2S}$.

Figure 9B:
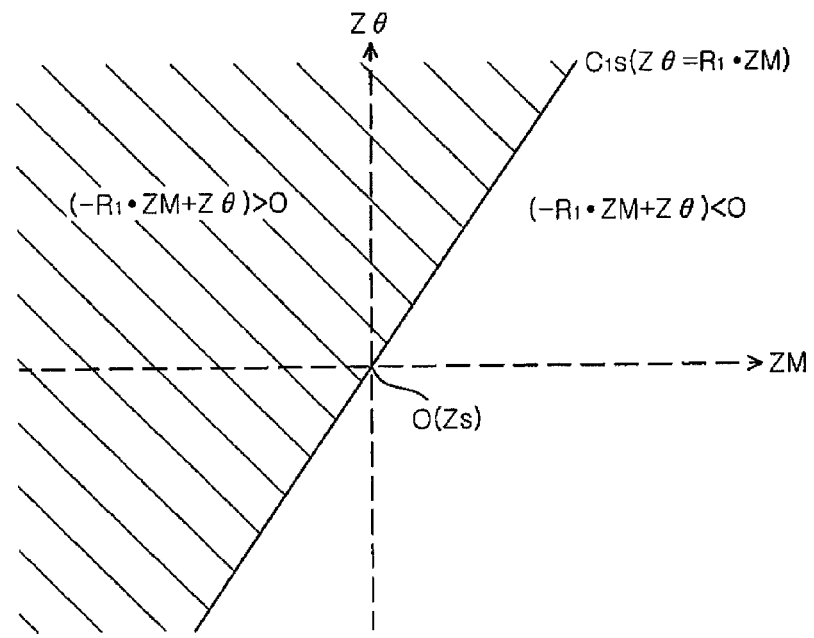

The calculation equation (6) indicates that when $-R_1 \cdot ZM + Z\theta$ has a positive value, $\Delta C_2$ becomes +1, and whereas when $-R_1 \cdot ZM + Z\theta$ has a negative value, $\Delta C_2$ becomes −1. In other words, as shown in FIG. 9B, when the operating point $Z_p$ is within the right plane region of two regions (plane region/shaded region) divided by the first reference line $C_{1S}$ on the impedance coordinates, $-R_2 \cdot ZM + Z\theta$ has a negative value and $C_2$ is varied by one step based on $\Delta C_2=-1$. On the other hand, when the operating point $Z_p$ is within the left shaded region, $-R_2 \cdot ZM + Z\theta$ has a positive value and $C_2$ is varied by one step $\Delta C_2=+1$. In both cases, when $C_2$ is varied by one step, the current $C_1$ coordinate axis $C_1(i)$ is moved by one pitch toward the first reference line $C_{1S}$.

It should be noted that the first matching algorithm enables the calculation operation and further the operating point moving operation to be performed quickly in a short period of time by using the simple calculation equations (5) and (6) without using a table.

In the above example (FIGS. 7A to 7D), it seems that the operating point $Z_p$ can be positioned close to the origin O (the matching point $Z_s$) when the basic movement pattern ($\Delta C_1=+1$, $\Delta C_2=+1$) of FIG. 7A is used compared to when the basic movement pattern of FIG. 7B is used. However, when the basic movement pattern of FIG. 7A is used, the $C_1$ coordinate axis $C_1(i)$ moves in a direction away from the first reference line $C_{1S}$ (to the right lower side), so that the convergence to the matching point is not achieved.

Figure 10:
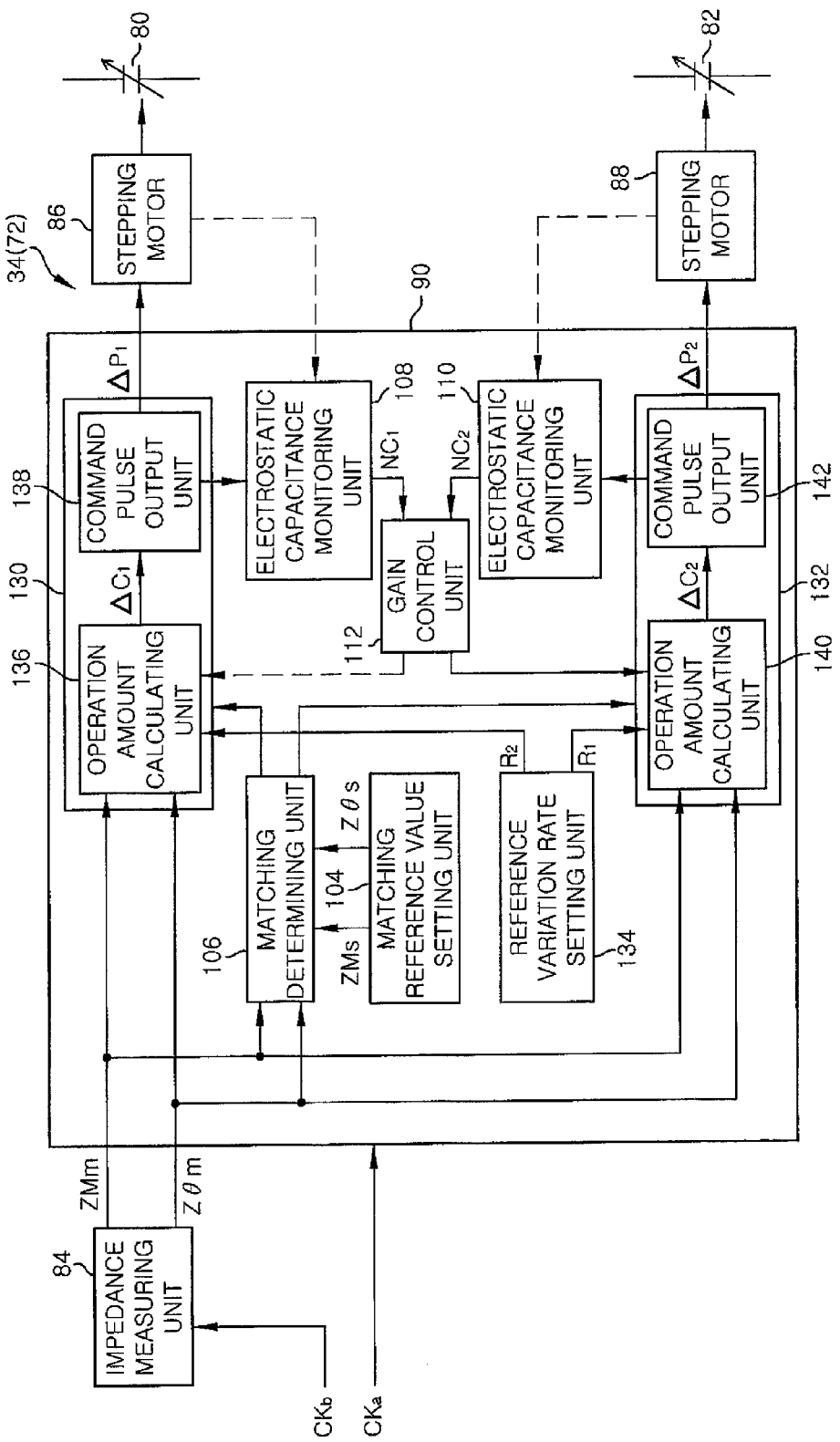
FIG. 10 is a block diagram showing main functions of a controller of the second example.

FIG. 10 shows the functional configuration of the controller 90 of the second example. In FIG. 10, like reference numerals will be used for like parts having the same configurations or functions as those of the components of the first example (FIG. 3).

The controller 90 of the second example functionally includes a first and a second matching control unit 130 and 132 of a feedback control system, a matching reference value setting unit 104, a matching determining unit 106, a reference variation setting unit 134, a first and a second electrostatic capacitance monitoring unit 108 and 110, and a gain control unit 112.

The first matching control unit 130 has a first operation amount calculating unit 136 and a first command pulse output unit 138. The first operation amount calculating unit 136 calculates the equation (5) by inputting the measured absolute value $ZM_m$ and the measured phase $Z\theta_m$ of the load impedance obtained by the impedance measuring unit 84 and the second inclination $R_2$ obtained by the reference variation rate setting unit 134. The first command pulse output unit 138 outputs a command pulse $\Delta P_1$ converted from the operation amount $\Delta C_1$ outputted from the first operation amount calculating unit 136.

The second matching control unit 132 has a second operation amount calculating unit 140 and a second command pulse output unit 142. The second operation amount calculating unit 140 calculates the equation (6) by inputting the measured absolute value $ZM_m$ and the measured phase $Z\theta_m$ of the load impedance obtained by the impedance measuring unit 84 and the first inclination $R_1$ obtained by the reference variation rate setting unit 134. The second command pulse output unit 142 outputs a command pulse $\Delta P_2$ converted from the operation amount $\Delta C_2$ outputted from the second operation amount calculating unit 140.

In the second embodiment, when the electrostatic capacitance monitoring units 108 and 110 and the gain control unit 112 apply to the second matching control unit 102 the gain correction (variable control) based on the current electrostatic capacitances $NC_1$ and $NC_2$ of the first and the second variable capacitor 80 and 82, the operation amount $\Delta C_2$ outputted from the second operation amount calculating unit 140 is corrected as indicated by a following equation (7).

$$\Delta C_2 \Rightarrow \pm 1 * (\alpha * NC_2^x / NC_1^y) \quad \text{Eq. (7)}$$

As a result of the above correction, the proportional gain of the second matching control unit 132 is decreased. In other words, in order to variably control $\Delta C_2$ by one step ($\pm 1$), the pulse rate of the command pulse outputted from the second command pulse output unit 142 is decreased by $\alpha * NC_2^x / NC_1^y$ times ($\geq 1$). Therefore, the variation per unit time in which the load impedance Z is varied toward the matching point $Z_s$ by the second matching control unit 142 is reduced and balanced with the variation per unit time in which the load impedance Z is varied toward the matching point $Z_s$ by the first matching control unit 130. As a result, hunting hardly occurs.

In the second embodiment as well, the proportional gain of the second matching control unit 132 is reduced based on the current electrostatic capacitances $NC_1$ and $NC_2$ of the first and the second variable capacitor 80 and 82, i.e., by the adaptive control. Hence, unnecessary speed decrease in a matching operation is not caused.

In the second embodiment as well, the adaptive control is performed such that the proportional gain of the second matching control unit 132 is properly decreased whereas the proportional gain of the first matching control unit 130 is fixed. However, the gain control unit 112 may perform the adaptive control such that the proportional gain of the first matching control unit 130 is properly increased. Hence, the gain variable control can be performed such that the proportional gain of the second matching control unit 132 is decreased compared to that of the first matching control unit 130. This is also applied to the first embodiment.

As described above, the present invention can be applied to any matching algorithm for variably controlling the electrostatic capacitances $C_1$ and $C_2$ ($C_1$ position and $C_2$ position) of the first and the second variable capacitor 80 and 82 such that the load impedance Z becomes close to the matching point $Z_s$. Thus, the basic calculation equation or the gain correction calculation equations (1) to (7) in the first and the second embodiment are only examples, and various basic calculation equations or gain correction calculation equations can be used in accordance with a matching algorithm to be used.

The present invention is not limited to the configuration of the automatic matching unit of the above-described embodiments, and each component of the automatic matching unit may be variously modified. Especially, a matching circuit including a first variable capacitor or a variable reactance element for controlling an absolute value of a load impedance and a second variable capacitor or a second variable reactance element for controlling a phase of a load impedance is included in the scope of the present invention.

In the plasma processing apparatus of the above-described embodiments, the first RF power for plasma generation and the second RF power for ion attraction are applied to the susceptor 12. However, although it is not shown, the plasma processing apparatus may be of a type in which only the RF power for plasma generation is applied to the lower electrode. Or, although it is not shown, the plasma processing apparatus may be of a type in which the RF power for plasma generation is applied to the upper electrode. In that case, the RF power for ion attraction may be applied to the lower electrode.

In the above-described embodiments, there has been described a capacitively coupled plasma processing apparatus for generating a plasma by a RF discharge between parallel plate electrodes in a chamber. However, the present invention can also be applied to an inductively coupled plasma processing apparatus for generating a plasma under an electromagnetic field by providing an antenna on top of or around the chamber, a microwave plasma processing apparatus for generating a plasma by using microwaves, or the like.

The present invention is not limited to the plasma etching apparatus, and can also be applied to other plasma processing apparatuses for performing plasma CVD, plasma oxidation, plasma nitriding, sputtering and the like. Further, a substrate to be processed is not limited to a semiconductor wafer, and can also be various substrates for used in a flat panel display, a photomask, a CD substrate, a printed circuit board and the like.

What is claimed is:

1. An automatic matching unit for automatically matching an impedance between an RF power supply for outputting RF power of a predetermined frequency and a load to which the RF power is supplied, the automatic matching unit comprising:
    a first variable capacitor connected in parallel to the load with respect to the RF power supply;
    a first stepwise capacitance varying mechanism for varying an electrostatic capacitance of the first variable capacitor in a stepwise manner;
    a second variable capacitor connected in series to the load with respect to the RF power supply;
    a second stepwise capacitance varying mechanism for varying an electrostatic capacitance of the second variable capacitor in a stepwise manner;
    an impedance measuring unit for measuring, at regular cycles, an absolute value and a phase of a load impedance as seen from an output terminal of the RF power supply;
    a first and a second matching control unit configured to respectively variably control the electrostatic capacitances of the first and the second variable capacitor through the first and the second stepwise capacitance varying mechanism such that the measured absolute value and the measured phase of the load impedance become close to a predetermined reference absolute value and a predetermined reference phase, respectively; and
    a reference variation rate setting unit configured to output a first inclination $R_1$ and a second inclination $R_2$ based on the following equations:

$$R_1 = \delta Z\theta_1 / \delta ZM_1, \text{ and}$$

$$R_2 = \delta Z\theta_2 / \delta ZM_2,$$

where $\delta ZM_1$ and $\delta Z\theta_1$ denote variations of the absolute value and the phase of the load impedance, respectively, in case of varying the electrostatic capacitance of the first variable capacitor by one step, and $\delta ZM_2$ and $\delta Z\theta_2$ denote variations of the absolute value and the phase of the load impedance, respectively, in case of varying the electrostatic capacitance of the second variable capacitor by one step,
    wherein the first matching control unit comprises a first operation amount calculating unit and a first command pulse output unit,
    wherein the first operation amount calculating unit is configured to calculate an operation amount $\Delta C_1$ of the electrostatic capacitance of the first variable capacitor based on a following equation:

$$\Delta C_1 = +1 \text{ if } R_2 * ZM - Z\theta > 0 \text{ or } -1 \text{ if } R_2 * ZM - Z\theta < 0,$$

where ZM and Z$\theta$ denote the absolute value and the phase of the load impedance, respectively, measured by the impedance measuring unit,
    wherein the first command pulse output unit is configured to output a first command pulse obtained from the operation amount $\Delta C_1$,
    wherein the second matching control unit comprises a second operation amount calculating unit and a second command pulse output unit,
    wherein the second operation amount calculating unit is configured to calculate an operation amount $\Delta C_2$ of the electrostatic capacitance of the second variable capacitor based on a following equation:

$$\Delta C_2 = +1 \text{ if } -R_1 * ZM + Z\theta > 0 \text{ or } -1 \text{ if } -R_1 * ZM + Z\theta < 0,$$

wherein the second command pulse output unit is configured to output a second command pulse obtained from the operation amount $\Delta C_2$, wherein the automatic matching unit further comprises:

an electrostatic capacitance monitoring unit for directly or indirectly monitoring the electrostatic capacitances of the first variable capacitor and the second variable capacitor, and a gain control unit configured to variably control, only when the current value of the electrostatic capacitance of the second variable capacitor is smaller than a preset threshold value, a proportional gain of the second matching control unit based on current values of the electrostatic capacitances of the first variable capacitor and the second variable capacitor obtained by the electrostatic capacitance monitoring unit such that the operation amount $\Delta C_2$ is corrected as indicated by a following equation:

$$\Delta C_2 \Rightarrow \pm 1*(\alpha * NC_2^x / NC_1^y),$$

where $NC_1$ and $NC_2$ respectively denote the current values of the electrostatic capacitances of the first and the second variable capacitor, $\alpha$ indicates a proportional coefficient, x and y satisfy $0 \leq x \leq 2$ and $0 \leq y \leq 2$, and $\alpha * NC_2^x / NC_1^y$ is equal to or smaller than 1.

2. The automatic matching unit of claim 1, wherein the gain control unit is configured to perform variable control such that the proportional gain of the second matching control unit is decreased compared to the proportional gain of the first matching control unit.

3. The automatic matching unit of claim 2, wherein the gain control unit is configured to variably control only the proportional gain of the second matching control unit.

* * * * *